(12) United States Patent
Lablans

(10) Patent No.: US 8,817,928 B2
(45) Date of Patent: Aug. 26, 2014

(54) METHOD AND APPARATUS FOR RAPID SYNCHRONIZATION OF SHIFT REGISTER RELATED SYMBOL SEQUENCES

(75) Inventor: Peter Lablans, Morris Township, NJ (US)

(73) Assignee: Ternarylogic LLC, Morristown, NJ (US)

( * ) Notice: Subject to any disclaimer, the term of this patent is extended or adjusted under 35 U.S.C. 154(b) by 595 days.

(21) Appl. No.: 13/118,767

(22) Filed: May 31, 2011

(65) Prior Publication Data

US 2011/0293062 A1 Dec. 1, 2011

Related U.S. Application Data

(60) Provisional application No. 61/350,247, filed on Jun. 1, 2010.

(51) Int. Cl.
| | |
|---|---|
| *H04L 7/00* | (2006.01) |
| *H04J 13/00* | (2011.01) |
| *H04J 13/10* | (2011.01) |
| *H03K 23/54* | (2006.01) |
| *G06F 7/58* | (2006.01) |

(52) U.S. Cl.
CPC ......... *H04J 13/0029* (2013.01); *H04J 13/0033* (2013.01); *H04J 13/10* (2013.01); *H04J 13/0074* (2013.01); *H03K 23/54* (2013.01); *G06F 7/584* (2013.01)
USPC .......................................................... 375/354

(58) Field of Classification Search
None
See application file for complete search history.

(56) References Cited

U.S. PATENT DOCUMENTS

| | | | |
|---|---|---|---|
| 4,747,105 A | 5/1988 | Wilson et al. | |
| 5,073,909 A * | 12/1991 | Kotzin et al. | 377/72 |
| 5,245,661 A | 9/1993 | Lee et al. | |
| 5,633,813 A | 5/1997 | Srinivasan | |
| 5,754,603 A * | 5/1998 | Thomas et al. | 375/367 |
| 5,799,010 A | 8/1998 | Lomp et al. | |
| 5,987,056 A | 11/1999 | Banister | |
| 6,181,255 B1 | 1/2001 | Crimmins et al. | |
| 6,212,174 B1 | 4/2001 | Lomp et al. | |
| 6,567,017 B2 | 5/2003 | Medlock et al. | |
| 6,606,342 B1 * | 8/2003 | Banister | 375/130 |
| 6,657,985 B1 | 12/2003 | Park | |
| 6,785,401 B2 | 8/2004 | Walker et al. | |
| 6,788,668 B1 * | 9/2004 | Shah et al. | 370/342 |
| 6,788,708 B1 * | 9/2004 | Rainish et al. | 370/479 |
| 7,301,985 B1 | 11/2007 | Hall et al. | |
| 7,349,447 B1 | 3/2008 | Sung et al. | |
| 7,398,287 B2 * | 7/2008 | An | 708/252 |
| 7,580,472 B2 | 8/2009 | Lablans | |
| 7,623,663 B2 | 11/2009 | Farris et al. | |
| 7,720,187 B2 * | 5/2010 | Mo et al. | 375/365 |

(Continued)

*Primary Examiner* — Chieh M Fan
*Assistant Examiner* — Bahman Badipour

(57) ABSTRACT

A sequence generator implemented on a receiver is synchronized with a sequence generator at a transmitter. The receiver receives k n-state symbols, with k>1 and n>1 wherein each of the k n-state symbols is associated with a generating state of the sequence generator at the transmitter. A processor in the receiver evaluates an n-state expression that generates an n-state symbol that is associated with a synchronized state of the receiver. Coefficients related to the n-state expression are stored on a memory and are retrieved by the processor. The synchronized state in one embodiment is part of a code hop. The sequence generator in the receiver may be part of a descrambler, of a communication device, of a data storage device and/or of an opening mechanism.

19 Claims, 20 Drawing Sheets

(56) References Cited

U.S. PATENT DOCUMENTS

| | | |
|---|---|---|
| 7,725,779 B2 * | 5/2010 | Lablans .................. 714/701 |
| 7,741,951 B2 | 6/2010 | Fitzgibbon |
| 7,865,807 B2 * | 1/2011 | Lablans .................. 714/781 |
| 7,899,130 B2 | 3/2011 | Tsui |
| 2002/0021686 A1 * | 2/2002 | Ozluturk et al. .............. 370/342 |
| 2005/0265430 A1 * | 12/2005 | Ozluturk et al. .............. 375/145 |
| 2007/0088997 A1 * | 4/2007 | Lablans .................. 714/724 |
| 2007/0239812 A1 * | 10/2007 | Lablans .................. 708/252 |
| 2007/0258516 A1 * | 11/2007 | Lablans .................. 375/233 |
| 2008/0016432 A1 * | 1/2008 | Lablans .................. 714/784 |
| 2009/0010431 A1 * | 1/2009 | De Vries et al. .............. 380/255 |
| 2009/0092250 A1 * | 4/2009 | Lablans .................. 380/255 |
| 2009/0327381 A1 * | 12/2009 | Morad .................. 708/252 |
| 2011/0016263 A1 * | 1/2011 | Lin et al. .................. 711/103 |
| 2011/0214038 A1 * | 9/2011 | Lablans .................. 714/784 |
| 2011/0276854 A1 * | 11/2011 | Lablans .................. 714/752 |

* cited by examiner

```
% states of shift register of LFSR based on configuration info
xor2=[1 2;2 1]; % XOR function
and2=[1 1;1 2]; % ADD function
conf=[0 0 1 0]+1; % configuration of LFSR without firs/last tap
m1=[conf(1) conf(1) conf(1) conf(1) conf(1)];% multiplier in tap into a2
m2=[conf(2) conf(2) conf(2) conf(2) conf(2)];% multiplier in tap into a3
m3=[conf(3) conf(3) conf(3) conf(3) conf(3)];% multiplier in tap into a4
m4=[conf(4) conf(4) conf(4) conf(4) conf(4)];% multiplier in tap into a5 shifsd=[1 0 0 0 0;0 1 0 0 0;0 0 1 0 0;0 0 0 1 0;0 0 0 0 1]+1;% initial shift register
sift(1,:)=[shifsd(1,:) 9 shifsd(2,:) 9 shifsd(3,:) 9 shifsd(4,:) 9 shifsd(5,:)];% all SR states % START PROCEDURE FOR DETERMINING SHIFT REGISTER CONTENT
for i=1:31
   in=shifsd(5,:);
   in5=m2t(m4,in); % signal in tap into a5
   % function m2t is vector operation for and2
   in4=m2t(m3,in); % signal in tap into a4
   in3=m2t(m2,in); % signal in tap into a3
   in2=m2t(m1,in); % signal in tap into a2 t5=sc2t(shifsd(4,:),in5); % calculated state of a5 after clock signal
   % sc2t is XOR operated over a vector
   t4=sc2t(shifsd(3,:),in4); % calculated state of a4 after clock signal
   t3=sc2t(shifsd(2,:),in3); % calculated state of a3 after clock signal
   t2=sc2t(shifsd(1,:),in2); % calculated state of a2 after clock signal
   % new shift register states after clock signal
   shifsd(5,:)=t5;
   shifsd(4,:)=t4;
   shifsd(3,:)=t3;
   shifsd(2,:)=t2;
   shifsd(1,:)=in;
   % STORE SHIFT REGISTER CONTENT IN MATRIX SIFT
   sift(i+1,:)=[shifsd(1,:) 9 shifsd(2,:) 9 shifsd(3,:) 9 shifsd(4,:) 9 shifsd(5,:)];
end
```

FIG. 15

```
function y=detb(bin)
% determine binary determinant
mb=[1 1;1 2];
sc2=[1 2;2 1];

lent=size(bin);
len=lent(1);

xx=len:-1:1;
xx;
ster=perms(xx);
pent=size(ster);
pen=pent(1);

sum=1;

for j=1:pen
    per=ster(j,:);
    k1=per(1);
    k2=per(2);
    k3=per(3);
    k4=per(4);
    k5=per(5);

a1=bin(1,k1);
    a2=bin(2,k2);
    pel=mb(a1,a2);
    a3=bin(3,k3);
    pel=mb(pel,a3);
    a4=bin(4,k4);
    pel=mb(pel,a4);
    a5=bin(5,k5);
    pel=mb(pel,a5);
    sum=sc2(sum,pel);
  end
  y=sum;
```

FIG. 16

```
% solve equations with Cramer's rule
% output is [1 0 1 1 1] first five symbols
zz=[2 1 2 2 2]'
cac=sift(1:5,25:29)
bac=cac;
bac(:,1)=zz;
a1=detb(bac)

bac=cac;
bac(:,2)=zz;
a2=detb(bac)

bac=cac;
bac(:,3)=zz;
a3=detb(bac)

bac=cac;
bac(:,4)=zz;
a4=detb(bac)

bac=cac;
bac(:,5)=zz;
a5=detb(bac)

```
% solve equations with Cramer's rule
% output is [1 0 1 1 1] five symbols on moments 1, 4, 7, 10 and 13
zz=[2 1 2 2 2]'
cac(1,:)=sift(1,25:29);
cac(2,:)=sift(4,25:29);
cac(3,:)=sift(7,25:29);
cac(4,:)=sift(10,25:29);
cac(5,:)=sift(13,25:29);

bac=cac;
bac(:,1)=zz;
a1=detb(bac)

bac=cac;
bac(:,2)=zz;
a2=detb(bac)

bac=cac;
bac(:,3)=zz;
a3=detb(bac)

bac=cac;
bac(:,4)=zz;
a4=detb(bac)

bac=cac;
bac(:,5)=zz;
a5=detb(bac)

```
% 4-state m-sequence 1
sc4=[1 2 3 4;2 1 4 3;3 4 1 2;4 3 2 1];
m4=[1 1 1 1;1 2 3 4;1 3 4 2;1 4 2 3];
shifts=[1 2 3 0 2]+1;

conf=[3 0 2 0 1 1];
zer=ones(1,5);
i0=zer+conf(1);
i1=zer+conf(2);
i2=zer+conf(3);
i3=zer+conf(4);
i4=zer+conf(5);
i5=zer+conf(6);
shifsd4=[1 0 0 0 0;0 1 0 0 0;0 0 1 0 0;0 0 0 1 0;0 0 0 0 1]+1;% initial shift register
sift4(1,:)=[shifsd(1,:) 9 shifsd(2,:) 9 shifsd(3,:) 9 shifsd(4,:) 9 shifsd(5,:)];% all SR states
% START PROCEDURE FOR DETERMINING SHIFT REGISTER CONTENT for i=1:1023 in=m4t(shifsd4(5,:),i5);
    in4=m4t(in,i4);
    in3=m4t(in,i3);
    in2=m4t(in,i2);
    in1=m4t(in,i1);
    in0=m4t(in,i0);
    t4=sc4t(shifsd4(4,:),in4);
    t3=sc4t(shifsd4(3,:),in3);
    t2=sc4t(shifsd4(2,:),in2);
    t1=sc4t(shifsd4(1,:),in1);
    shifsd4(5,:)=t4;
    shifsd4(4,:)=t3;
    shifsd4(3,:)=t2;
    shifsd4(2,:)=t1;
    shifsd4(1,:)=in0;

% STORE SHIFT REGISTER CONTENT IN MATRIX SIFT4
    sift4(i+1,:)=[shifsd4(1,:) 9 shifsd4(2,:) 9 shifsd4(3,:) 9 shifsd4(4,:) 9 shifsd4(5,:)];
end
```

FIG. 21

```
function y=detb4(bin)
% determine 4-state determinant sc4=[1 2 3 4;2 1 4 3;3 4 1 2;4 3 2 1];
m4=[1 1 1 1;1 2 3 4;1 3 4 2;1 4 2 3];
lent=size(bin);
len=lent(1);

xx=len:-1:1;
xx;
ster=perms(xx);
pent=size(ster);
pen=pent(1);

sum=1;

for j=1:pen
     per=ster(j,:);
     k1=per(1);
     k2=per(2);
     k3=per(3);
     k4=per(4);
     k5=per(5);

a1=bin(1,k1);
     a2=bin(2,k2);
     pel=m4(a1,a2);
     a3=bin(3,k3);
     pel=m4(pel,a3);
     a4=bin(4,k4);
     pel=m4(pel,a4);
     a5=bin(5,k5);
     pel=m4(pel,a5);
     sum=sc4(sum,pel);
  end
  y=sum;
```

FIG. 22

```
% solve equations with Cramer's rule
% output is [1 0 2 3 1] five 4-state symbols
zz=[2 1 3 4 2]'
cac=sift4(1:5,25:29);
bac=cac;
bac(:,1)=zz;
a1=detb4(bac)

bac=cac;
bac(:,2)=zz;
a2=detb4(bac)

bac=cac;
bac(:,3)=zz;
a3=detb4(bac)

bac=cac;
bac(:,4)=zz;
a4=detb4(bac)

bac=cac;
bac(:,5)=zz;
a5=detb4(bac)

METHOD AND APPARATUS FOR RAPID SYNCHRONIZATION OF SHIFT REGISTER RELATED SYMBOL SEQUENCES

CROSS-REFERENCE TO RELATED APPLICATIONS

This application claims the benefit of U.S. Provisional Patent Application Ser. No. 61/350,247, filed Jun. 1, 2010 which is incorporated herein by reference in its entirety.

BACKGROUND OF THE INVENTION

The present invention relates to synchronization of shift registers in apparatus on transmitting and on receiving sides.

Linear Feedback Shift Registers (LFSRs) are known and are applied in applications such as sequence generators, scramblers, coders, descramblers and decoders. An LFSR can be a binary LFSR wherein a shift register element can hold a binary symbol, the binary symbol being represented by a binary signal. An LFSR can be a non-binary LFSR, wherein a shift register element can hold a non-binary symbol; a non-binary symbol having one of n states with n>2. A single non-binary symbol can be represented by a signal. In one embodiment such a signal representing a non-binary symbol can be a single non-binary signal able to have one of n states. A non-binary symbol in another embodiment can be represented by a plurality of signals, for instance, by a plurality of binary signals. For instance, an 8-state symbol can be represented by a word of 3 bits, each bit being represented by a binary signal.

A binary or n-state LFSR can be in Fibonacci or in Galois configuration.

In many applications, including in scrambling and descrambling and in spread-spectrum modulation a sequence of n-state symbols with n≥2 and n>2, some knowledge is required about a phase or synchronization of a sequence that was transmitted from a transmitter in order to be detected or decoded at a receiver. In the instant application, an n-state sequence is assumed to be associated with an n-state LFSR. In some cases one wants to know how a phase or synchronization point of a received sequence relates to an initial state of a sequence generator. In other cases one would like to start generating in parallel to a received sequence a sequence that is synchronized with the received sequence.

In general one applies one or more transition matrices to determine a state of an LFSR compared to a known state or to initiate an LFSR. Such calculations can be quite extensive and time consuming. Accordingly, novel and improved methods and apparatus are required to determine a desired state of an n-state LFSR with n≥2 or n>2.

The inventor has described in earlier patent applications how after determining an error location in a codeword one can determine the correct symbol value without first determining an error magnitude. Also described in earlier patent applications is the up-and-down approach in determining intermediate coding states. These aspects are described in U.S. Provisional Patent Application No. 60/807,087, filed Jul. 12, 2006, and U.S. Provisional Patent Application No. 60/821,980 filed Aug. 10, 2006 which are both incorporated herein by reference in their entirety. U.S. patent application Ser. No. 11/739,189 filed Apr. 26, 2007 and U.S. patent application Ser. No. 11/743,893 filed May 3, 2007 and U.S. patent application Ser. No. 11/775,963 filed on Jul. 11, 2007 are also incorporated herein by reference in their entirety.

SUMMARY OF THE INVENTION

One aspect of the present invention provides a novel method and apparatus that can rapidly synchronize a sequence generator of n-state symbols, with n>1, and k>1, associated with a k-stage n-state LFSR and wherein each n-state symbol is represented by a signal with a sequence generator at a transmitting side by using k n-state symbols that are generated by the generator at the transmitting side.

In accordance with an aspect of the present invention a method is provided for synchronizing a sequence generator associated with an n-state k-stage, Linear Feedback Shift Register (LFSR) with n>1 and k>1, comprising a processor receiving at least k n-state symbols, a symbol being represented by a signal, the processor determining a generating state of the sequence generator by executing an n-state expression having the k n-state symbols as variables, and generating by the sequence generator of an n-state symbol associated with the generating state.

In accordance with another aspect of the present invention a method is provided for synchronizing a sequence generator, wherein n>2.

In accordance with yet another aspect of the present invention a method is provided for synchronizing a sequence generator, further comprising the processor evaluating (k−1) additional generating states.

In accordance with yet another aspect of the present invention a method is provided for synchronizing a sequence generator, wherein coefficients of the n-state expression are stored in a memory.

In accordance with yet another aspect of the present invention a method is provided for synchronizing a sequence generator, wherein the k n-state symbols are not generated consecutively.

In accordance with yet another aspect of the present invention a method is provided for synchronizing a sequence generator, further comprising, the processor receiving data determining a configuration of the n-state k-stage LFSR, and the processor determining the n-state expression from the at least k n-state symbols and the configuration of the n-state k-stage LFSR.

In accordance with yet another aspect of the present invention a method is provided for synchronizing a sequence generator, wherein the sequence generator generates a sequence that is a combination of at least two sequences.

In accordance with yet another aspect of the present invention a method is provided for synchronizing a sequence generator, wherein the generating state is part of a code hop.

In accordance with yet another aspect of the present invention a method is provided for synchronizing a sequence generator, wherein the processor is part of a device that activates a mechanism.

In accordance with yet another aspect of the present invention a method is provided for synchronizing a sequence generator, wherein the processor is part of a communication device.

In accordance with a further aspect of the present invention an apparatus is provided to synchronize a sequence generator associated with an n-state k-stage, Linear Feedback Shift Register (LFSR) with n>1 and k>1, comprising a processor enabled to process n-state symbols, an n-state symbol being represented by a signal, to perform the steps of receiving at least k n-state symbols, evaluating a generating state of the sequence generator by executing an n-state expression of k terms applying the k n-state symbols as variables and generating by the sequence generator of an n-state symbol associated with the generating state.

In accordance with yet a further aspect of the present invention an apparatus is provided to synchronize a sequence generator, wherein n>2.

In accordance with yet a further aspect of the present invention an apparatus is provided to synchronize a sequence generator, further comprising the processor performing the step of synchronizing a shift register in a sequence generator.

In accordance with yet a further aspect of the present invention an apparatus is provided to synchronize a sequence generator, wherein coefficients of the n-state expression are stored in a memory that is accessed by the processor.

In accordance with yet a further aspect of the present invention an apparatus is provided to synchronize a sequence generator, wherein the processor synchronizes a receiver with a transmitter.

In accordance with yet a further aspect of the present invention an apparatus is provided to synchronize a sequence generator, wherein the processor is part of a wireless receiver.

In accordance with yet a further aspect of the present invention an apparatus is provided to synchronize a sequence generator, wherein the sequence generator is a selected from the group that consists of a Gold sequence generator and a Kasami sequence generator.

In accordance with yet a further aspect of the present invention an apparatus is provided to synchronize a sequence generator, wherein the processor is part of a communication device.

In accordance with yet a further aspect of the present invention an apparatus is provided to synchronize a sequence generator, wherein the processor performs a code hop.

In accordance with yet a further aspect of the present invention an apparatus is provided to synchronize a sequence generator, wherein the processor is part of a data storage device.

DESCRIPTION OF THE DRAWINGS

FIGS. 15-18 illustrate steps in accordance with one or more aspects of the present invention;

FIGS. 21-23 illustrate further steps in accordance with one or more aspects of the present invention;

DETAILED DESCRIPTION

Various embodiments of the invention are discussed in detail below. While specific implementations are discussed, it should be understood that this is done for illustration purposes only. A person skilled in the relevant art will recognize that other components and configurations may be used without parting from the spirit and scope of the invention. Also, it is to be understood that the phraseology and terminology used herein is for the purpose of description and should not be regarded as limiting. The use of "including," "comprising," or "having" and variations thereof herein are meant to encompass the items listed thereafter and equivalents thereof as well as additional items.

Figure 1:
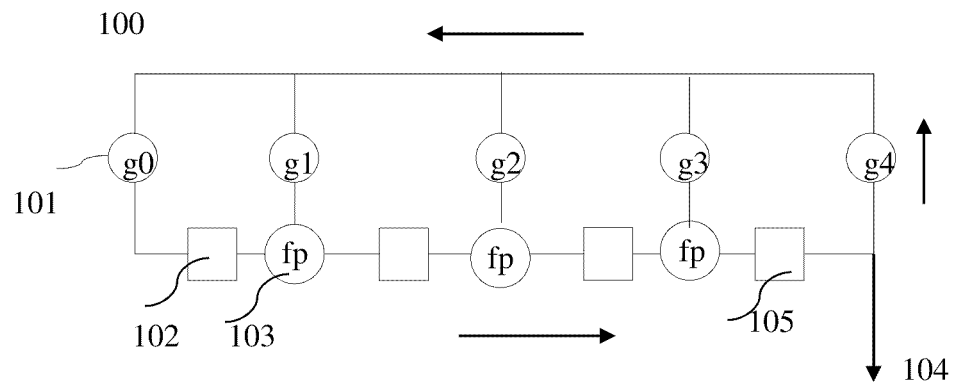
FIGS. 1-2 are examples of n-state LFSRs in Galois and Fibonacci configuration with n≥2.

Sequences of n-state symbols can be generated by linear feedback shift registers (LFSRs). The LFSR can be used in an autonomous configuration, working off a clock signal starting at an initial setting of the shift register. The LFSR associated sequence generator can be in Galois configuration as shown in FIG. 1. The generator 100 has a 4 element shift register of which first element 102 and last element 105 are identified, each element is able to hold and shift one n-state symbol (with n≥2). At least two adjacent shift register elements are connected through a device 103 that implements a two-input single output n-state switching function fp. In general, when n=2 (or in binary implementations) fp is the binary XOR function though the EQUAL can also serve that purpose. A multiplier for n=2 is the binary AND function, though for instance the NAND function can also serve that purpose. The truth tables of the XOR and AND are provided below.

| XOR | | | AND | | |
|---|---|---|---|---|---|
|   | 0 | 1 |   | 0 | 1 |
| 0 | 0 | 1 | 0 | 0 | 0 |
| 1 | 1 | 0 | 1 | 0 | 1 |

For n>2 fp can be any n-state reversible 2-input single output n-state switching function. For instance fp is an adder over GF(n). (wherein GF stands for Galois Field or Finite Field).

For many applications it is beneficial when the sequence generator provides for instance on an output 104 a maximum length or m-sequence. Such a pseudo-random sequence has $n^4-1$ n-state symbol. The length of an n-state sequence depends on the number of shift register elements. When the LFSR has p shift register elements the maximum length is $n^p-1$ n-state symbols. Feed-back loops are created through n-state inverters g0, g1, g2, g3 and g4 of which g0 is identified as 101. In general the applied inverters are multipliers over GF(n). The inverter has shown, for instance, in U.S. Pat. No. 7,487,194 issued on Feb. 3, 2009 and which is incorporated herein by reference that also n-state inverters not being multipliers over GF(n) can be applied.

One way to determine if a sequence of n-state symbols is maximum length is by determining the auto-correlation graph of a sequence of $n^p-1$ n-state symbols. When the sequence is maximum length the autocorrelation graph of such sequence is substantially flat with at least one peak. The inventor has shown in, for instance, U.S. Pat. No. 7,580,472 issued on Aug. 25, 2009, which is incorporated herein by reference, that by only adding a fixed value to a sum when two n-state symbols are identical (and if desired subtracting a fixed value if two n-state symbols are different) that also for n>2 the autocorrelation graph of n-state m-sequences has only one peak.

One can create different 4-stage n-state sequence generators that will generate n-state m-sequences. The inverters g0 and g4 always have to be an inverter not being the multiplier-0 inverter. In the binary case the binary configuration [g0 g1 g2 g3 g4]=[1 0 0 1 1] of FIG. 1 can generate a binary m-sequence of 15 binary symbols. In one case fp is the binary XOR function. In the 8-state case the 8-state configuration [g0 g1 g2 g3 g4]=[4 2 1 2 1] of FIG. 1 can generate an 8-state sequence of 4095 of 8-state symbols. The inverters herein are multipliers over GF(8) and fp is an addition over GF(8).

The following truth tables define the addition and multiplication over GF(8).

The following truth tables describe the 8-state function fp being an adder over GF(8).

| c | | | | | b | | | | |
|---|---|---|---|---|---|---|---|---|---|
|   | fp | 0 | 1 | 2 | 3 | 4 | 5 | 6 | 7 |
|   | 0  | 0 | 1 | 2 | 3 | 4 | 5 | 6 | 7 |
|   | 1  | 1 | 0 | 4 | 7 | 2 | 6 | 5 | 3 |
| a | 2  | 2 | 4 | 0 | 5 | 1 | 3 | 7 | 6 |
|   | 3  | 3 | 7 | 5 | 0 | 6 | 2 | 4 | 1 |
|   | 4  | 4 | 2 | 1 | 6 | 0 | 7 | 3 | 5 |
|   | 5  | 5 | 6 | 3 | 2 | 7 | 0 | 1 | 4 |
|   | 6  | 6 | 5 | 7 | 4 | 3 | 1 | 0 | 2 |
|   | 7  | 7 | 3 | 6 | 1 | 5 | 4 | 2 | 0 |

The truth table of the multiplication m8 over GF(8) is provided in the following truth table.

| c | | | | | b | | | | |
|---|---|---|---|---|---|---|---|---|---|
|   | m8 | 0 | 1 | 2 | 3 | 4 | 5 | 6 | 7 |
|   | 0  | 0 | 0 | 0 | 0 | 0 | 0 | 0 | 0 |
|   | 1  | 0 | 1 | 2 | 3 | 4 | 5 | 6 | 7 |
| a | 2  | 0 | 2 | 3 | 4 | 5 | 6 | 7 | 1 |
|   | 3  | 0 | 3 | 4 | 5 | 6 | 7 | 1 | 2 |
|   | 4  | 0 | 4 | 5 | 6 | 7 | 1 | 2 | 3 |
|   | 5  | 0 | 5 | 6 | 7 | 1 | 2 | 3 | 4 |
|   | 6  | 0 | 6 | 7 | 1 | 2 | 3 | 4 | 5 |
|   | 7  | 0 | 7 | 1 | 2 | 3 | 4 | 5 | 6 |

It should be clear that the herein provided generators are illustrative examples only. One may create generators for any value of n≥2 and for any LFSR with p shift register elements with p≥2.

At a receiving apparatus it may be important to generate an identical n-state sequence that is in phase with the received n-state sequence. There are several issues that may arise. For instance, in case of a sequence generated by a sequence generator being an LFSR in Galois configuration, the received symbols are different from the content of the shift register elements that generate these n-state symbols. Furthermore, it may not be possible to enter or synchronize the shift register elements of a sequence generator, but at least one clock cycle may have to be reserved to calculate the state of the shift register elements. In general, a state transition matrix or a series of matrices is used to calculate the required state of the shift register elements.

The phase of an n-state sequence of symbols is determined by the number of clock pulses after initialization and the initial state of the sequence generator. At the receiving end one only has the received sequence of symbols.

A maximum-length sequence or m-sequence of n-state symbols generated by an LFSR with p n-state shift register elements has some particular properties that can be used in determining a synchronization state. First of all, an n-state symbol generated on an output at moment t (in the example 105, but other outputs can be used) is associated with the content of the shift register elements (in this case for instance [a b c d] at moment t. In fact, output 105 provides the content of the last shift register element of LFSR 100. When the content of the shift register is [a b c d] then the generated output symbol is symbol 'd'. This is somewhat helpful, as the symbol 'd' will be generated several times (in fact about 512 times in the 8-state example).

Another property of the m-sequence generator is that its performance is cyclic. After $n^p-1$ clock cycles the generator starts all over again with generating the same sequence. Where the sequence generator is at a time t1 depends on the initial state of the shift register elements on 'start time' t0. Another property of the n-state m-sequence generator is that during generation of the m-sequence at each moment the total content of the shift register elements is unique. One may say that at each moment of generating an n-state symbol of the m-sequence the content of the p shift register elements forms a word of p n-state symbols. Each word of p n-state symbols during the generation of n-state symbols on an output is unique. The words repeat again due to the cyclic nature of the m-sequence generator.

One may extend such a word to a second word with symbols of future or past states. These words will also be unique. The smallest unique word is the word of p n-state symbols. Each word of at least p n-state symbols representing a content of the shift register is associated with a generated n-state symbol. One may also divide the n-state m-sequence is a plurality of words of p n-state symbols. This is, for instance, described in U.S. patent application Ser. No. 11/534,837 filed on Sep. 25, 2006, which is incorporated herein by reference in its entirety.

However, if one wants to start a local sequence generator to be in sync with a received sequence of n-state symbols, one needs to have a method or apparatus how to initialize such a local sequence generator.

Figure 4:
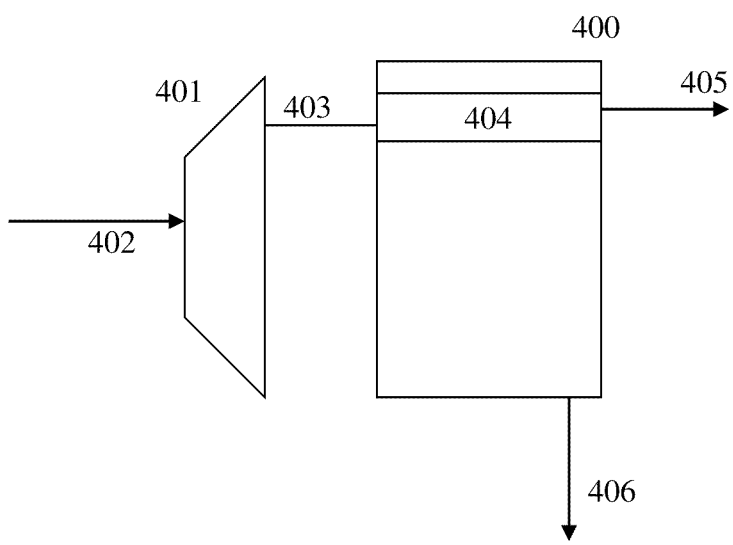
FIG. 4 illustrate an implementation of an n-state sequence generator with an addressable memory as an aspect of the present invention.

An n-state m-sequence that is associated with an LFSR of p n-state shift register elements is thus fully determined by at least p consecutive n-state symbols in the m-sequence. This offers at least one embodiment of synchronization. Assume that an m-sequence of 4095 8-state symbols is being received and a sequence in sync with this sequence is to be generated. The embodiment of FIG. 4 illustrates such synchronization. An input 402 of an address decoder 401 is provided with 4 received consecutive 8-state symbols as an address to an addressable memory 400. The 4 8-state symbols enable memory line 403 so that the content of memory device 404 can be outputted. In one embodiment, 404 is outputted on output 405, wherein the content of 404 is the complete sequence following the received 4 8-state symbols. One may take into account latency in switching devices and provide a delay of one or more clock cycles. In that case, 405 generates the remainder of the 8-state m-sequence which can be under control of a clock so that 405 provides the 8-state symbols at the right moment. In this embodiment, an 8-state symbol may be represented by a single 8-state signal or by a plurality of signals, for instance binary signals.

The above embodiment requires that several shifted versions of the m-sequence have to be stored. One may limit the number of stored sequences, for instance to 8. This means that there may be a delay of up to 511 clock cycles until an in-sync m-sequence is generated. One may restart the reading of a memory line if no other command is provided.

In a further embodiment a single 8-state (or n-state) symbol is provided by memory 404 on output 406. Enabling a first memory line 403 may be considered as an initialization of the memory. At each following clock cycle, a next memory line is enabled to read the next memory element containing a next symbol in the m-sequence. After enabling the last memory line the first memory line is enabled to read the first memory to provide the first stored 8-state symbol. Only after providing a new initial address at 402, possibly with enabling a command line, is the memory re-initialized. Each symbol in the memory in this embodiment is associated with the 4 preceding symbols. In case of a desired delay one may associate a to be generated symbol with 4 preceding symbols including 1 or more intervening symbols. In case of no delay the first to be generated symbol is the symbol directly following the 4 symbols at the input of the address decoder. Each following memory line then stores the succeeding symbols in the m-sequence. It should be clear that this synchronization by memory does not distinguish between Fibonacci or Galois configuration generated m-sequences.

In many cases it is desired to initialize a true LFSR for synchronization. In that case it is required to determine an initialization state of the LFSR. What seems to be one way to synchronize an LFSR in a receiver with a sequence generated by a transmitter and associated with an LFSR, is to determine a lag or difference in cycles between a transmitter LFSR and a receiver LFSR and to calculate the receiver LFSR state by executing the transition matrix (or equivalent) k times, wherein k is the number of clock cycles wherein transmitter and receiver differ.

The relationship between state of the LFSR and generated n-state symbols will be provided herein for the binary case (n=2) and the 8-state case for an LFSR with 4 shift register elements. It is to be understood that the herein provided approach can also be applied for all other values for n>2 and for all p>2.

The Binary Case

There are 4 shift register elements in the generator of FIG. 1. Assume that the initial value of the shift register elements is [a b c d] wherein a, b, c and d can be an element of for instance {0, 1}. It is not sure which state or value each of a, b, c and d will be. Represent the first shift register element as [a 0 0 0]. This means that the first symbol in [a 0 0 0] can be a 0 or a 1, but the second, third and fourth symbol in [a 0 0 0] are always 0. To make processor manipulation easier [a 0 0 0] is replaced by [1 0 0 0]. The meaning of [1 0 0 0] is the same as [a 0 0 0]; the first symbol ('a') can be 0 or 1, but all others are always 0. The second shift register element is then [0 1 0 0]; the third [0 0 1 0] and the fourth shift register element is [0 0 0 1]. The binary sequence generator has multipliers or inverters [g0 g1 g2 g3 g4]=[1 0 0 1 1].

When the content of the first element is shifted to the second shift register element then the second shift register element is [1 0 0 0]. Looking at FIG. 1 it should be clear that the output of the fourth shift register element [0 0 0 1] is fed back into the LFSR and for instance added (XORed) with the content of the third shift register element [0 0 1 0]. The XOR is associative, commutative and distributive. Adding (XORing) [0 0 1 0]+[0 0 0 1]=[0 0 1 1]. So after the shift the first shift register element will have the content of the fourth shift register element [0 0 0 1], the second shift register element will be [0 1 0 0]. It is easy to check that the third element will be [0 1 0 0] and the fourth will be [0 0 1 1].

Accordingly, the initial content of the LFSR was:

[1 0 0 0]-[0 1 0 0]-[0 0 1 0]-[0 0 0 1].

After the first shift the content of the LFSR is:

[0 0 0 1]-[1 0 0 0]-[0 1 0 0]-[0 0 1 1].

The next shift will provide shift register:

[0 0 1 1]-[0 0 0 1]-[1 0 0 0]-[0 1 1 1].

The following table shows 15 shifts after initialization.

| state based | SR1 | SR2 | SR3 | SR4 | SG |
|---|---|---|---|---|---|
| Init | 1 0 0 0 | 0 1 0 0 | 0 0 1 0 | 0 0 0 1 | 0 0 0 1 |
| 1 | 0 0 0 1 | 1 0 0 0 | 0 1 0 0 | 0 0 1 1 | 0 0 1 1 |
| 2 | 0 0 1 1 | 0 0 0 1 | 1 0 0 0 | 0 1 1 1 | 0 1 1 1 |
| 3 | 0 1 1 1 | 0 0 1 1 | 0 0 0 1 | 1 1 1 1 | 1 1 1 1 |
| 4 | 1 1 1 1 | 0 1 1 1 | 0 0 1 1 | 1 1 1 0 | 1 1 1 0 |
| 5 | 1 1 1 0 | 1 1 1 1 | 0 1 1 1 | 1 1 0 1 | 1 1 0 1 |
| 6 | 1 1 0 1 | 1 1 1 0 | 1 1 1 1 | 1 0 1 0 | 1 0 1 0 |
| 7 | 1 0 1 0 | 1 1 0 1 | 1 1 1 0 | 0 1 0 1 | 0 1 0 1 |
| 8 | 0 1 0 1 | 1 0 1 0 | 1 1 0 1 | 1 0 1 1 | 1 0 1 1 |
| 9 | 1 0 1 1 | 0 1 0 1 | 1 0 1 0 | 0 1 1 0 | 0 1 1 0 |
| 10 | 0 1 1 0 | 1 0 1 1 | 0 1 0 1 | 1 1 0 0 | 1 1 0 0 |
| 11 | 1 1 0 0 | 0 1 1 0 | 1 0 1 1 | 1 0 0 1 | 1 0 0 1 |
| 12 | 1 0 0 1 | 1 1 0 0 | 0 1 1 0 | 0 0 1 0 | 0 0 1 0 |
| 13 | 0 0 1 0 | 1 0 0 1 | 1 1 0 0 | 0 1 0 0 | 0 1 0 0 |
| 14 | 0 1 0 0 | 0 0 1 0 | 1 0 0 1 | 1 0 0 0 | 1 0 0 0 |
| 15 | 1 0 0 0 | 0 1 0 0 | 0 0 1 0 | 0 0 0 1 | 0 0 0 1 |

The table shows that after 15 shifts the shift register has returned to its original state. One can also see that a shift register element during the 15 shifts only has a certain state only once. What we see is of course the total state of a shift register element and not the constituting parts. Also, in a row a certain state (the constituting parts one) only appears once. Two shift register elements will not have the same constituting parts at the same time. Further more, each shift register elements at any time is determined by the initial states of the shift registers.

Furthermore, it does not really matter which moment is called the 'init' moment. Once an 'init' moment is determined then the follow-on states are completely set. Also, the generated symbols on output 105 are completely determined, and are equal to the content (in this case) of the last shift register element.

Assume that the received sequence is [1 1 0 1 0 1 1 0 0 1 0 0 0 1 1]. One would like to initiate an LFSR as shown in FIG. 1 one moment 6 after having received 5 symbols. Only four symbols are required to synchronize. Assume one uses the first 4 received symbols to synchronize. Further assume that the first symbol is generated at initial shift register state [u 0 0 0] [0 v 0 0] [0 0 w 0] [0 0 0 z] to generate a=[0 0 0 z].

One should keep in mind that [0 0 0 z] actually means [0≠0≠0≠z]. This means that a=(0≠0≠0≠z) or a=z. The symbol "≠" in these expressions is used as a notation for the binary function XOR, of which the switching table is provided earlier above.

The second symbol is 'b'. From the above table one can read that b=[0 0 1 1] or b=(0≠0≠w≠z) or b=(w≠z). It was already determined that z=a. Thus, w=(a≠b).

The other equations will lead to v=(b≠c) and u=(c≠d). From the received sequence [a b c d]=[1 1 0 1]. This will lead to [u 0 0 0]=[1 0 0 0]; [0 v 0 0]=[0 1 0 0]; [0 0 w 0]=[0 0 0 0] and [0 0 0 z]=[0 0 0 1]. Thus the initial state of the shift register is [u v w z]=[1 1 0 1]. By applying the calculated initial values of the shift register elements one can check that indeed the provided m-sequence is generated.

The required content of the shift register at moment 6 is

| 1 1 1 0 | 1 1 1 1 | 0 1 1 1 | 1 1 0 1 |

With u=1; v=1, w=0 and z=1 this will lead to LFSR state [0 1 0 1] to start running in sync with the received m-sequence. One may in a further embodiment apply a phase-lock-loop (PLL) circuit to derive the appropriate clock signals for the synchronized LFSR at the receiving side.

In general one may define the number of clock cycles required to calculate and to initiate an LFSR. For instance it may require 5 clock cycles to calculate the correct content of the shift register elements and to load the required content into the shift register. One should thus take any 4 consecutive received symbols from an m-sequence, calculate the content and load the content into the shift register and start accepting symbols from the initiated LFSR on moment 9 (assuming that 'init' and moment 1, 2 and 3 are used to perform the processing). The system thus should calculate the LFSR state for moment 9.

One may store all the states related to an initial state of an LFSR in a memory. This does not require a lot of memory in the binary 4 element LFSR. In case of a 10 element binary LFSR a 1023 bit m-sequence can be generated. Each output bit can be associated with 10 states of 10 bits each. That requires a storage space of around 100 k. Though not enormous, it is substantial. However, it may be assumed that in certain cases not all states are required. For instance one may want to synchronize only at certain moments, unless one constantly monitors all states derived from an initial state. For instance, one may capture k consecutive symbols of a sequence at a time frame $t0+(k-1)*ts$, wherein is the time reserved for one symbol. In general, one determines an initialization or synchronization for a certain moment tp. At this moment tp the synchronized sequence is started and will be self sustained. In a self sustained generation of a sequence one does not need further input and no further states are required.

In a further embodiment one may not want to rely on the local generator. For instance one may assume that the received and processed symbols of the k symbols can be used for synchronization at moment tp1, tp2, tp3, . . . etc. One can thus calculate and store the relevant states based on the k received symbols and initialize the sequence at the receiving side on these moments with the calculated states. These states will represent a small portion of the total states and can easily be stored in a memory. The advantage of this is that initiating a state is thus independent in calculation effort of the moment of initialization. Each state is retrieved from a memory and takes an execution of an expression to be finalized. The calculation of such a state in binary form is very simple. In essence it is an AND operation between the stored state and the calculated initial state. For instance in the binary form of the FIG. 1 generator using the above state table, the third shift register element at moment 11 should have content [1 0 1 1]. One simply takes the AND between [1 0 1 1] and [a b c d] related to initial states [a 0 0 0], [0 b 0 0], [0 0 c 0] and [0 0 0 d], followed by the XOR of the result.

One may also recalculate all states as a function of 4 consecutive output symbols. This allows calculating a state of a shift register element directly from the value of 4 consecutive n-state symbols. In the binary case 4 consecutive symbols on output 105 in FIG. 1 are [a b c d]. In line with the binary LFSR state table: a=[0 0 0 1], b=[0 0 1 1], c=[0 1 1 1] and d=[1 1 1 1]. One may call the initial states [1 0 0 0]=u, [0 1 0 0]=v, [0 0 1 0]=w and [0 0 0 1]=z.

This leads to u=c+d; v=c+b, w=a+b, and z=a. One can thus represent the 4 shift register elements with initial states [1 1 0 0] [0 1 1 0] [0 0 1 1] [0 0 0 1] as function of the 4 consecutive symbols generated from the initial state. One can generate the following states in a similar way as provided earlier, but now using the states as function of the generated symbols.

The following table shows 15 shifts after initialization using the generated 4 symbols starting with the initial state as variables.

| symbol based | SR1 | SR2 | SR3 | SR4 | SG |
|---|---|---|---|---|---|
| init | 1 1 0 0 | 0 1 1 0 | 0 0 1 1 | 0 0 0 1 | 0 0 0 1 |
| 1 | 0 0 0 1 | 1 1 0 0 | 0 1 1 0 | 0 0 1 0 | 0 0 1 0 |
| 2 | 0 0 1 0 | 0 0 0 1 | 1 1 0 0 | 0 1 0 0 | 0 1 0 0 |
| 3 | 0 1 0 0 | 0 0 1 0 | 0 0 0 1 | 1 0 0 0 | 1 0 0 0 |
| 4 | 1 0 0 0 | 0 1 0 0 | 0 0 1 0 | 1 0 0 1 | 1 0 0 1 |
| 5 | 1 0 0 1 | 1 0 0 0 | 0 1 0 0 | 1 0 1 1 | 1 0 1 1 |
| 6 | 1 0 1 1 | 1 0 0 1 | 1 0 0 0 | 1 1 1 1 | 1 1 1 1 |
| 7 | 1 1 1 1 | 1 0 1 1 | 1 0 0 1 | 0 1 1 1 | 0 1 1 1 |
| 8 | 0 1 1 1 | 1 1 1 1 | 1 0 1 1 | 1 1 1 0 | 1 1 1 0 |
| 9 | 1 1 1 0 | 0 1 1 1 | 1 1 1 1 | 0 1 0 1 | 0 1 0 1 |
| 10 | 0 1 0 1 | 1 1 1 0 | 0 1 1 1 | 1 0 1 0 | 1 0 1 0 |
| 11 | 1 0 1 0 | 0 1 0 1 | 1 1 1 0 | 1 1 0 1 | 1 1 0 1 |
| 12 | 1 1 0 1 | 1 0 1 0 | 0 1 0 1 | 0 0 1 1 | 0 0 1 1 |
| 13 | 0 0 1 1 | 1 1 0 1 | 1 0 1 0 | 0 1 1 0 | 0 1 1 0 |
| 14 | 0 1 1 0 | 0 0 1 1 | 1 1 0 1 | 1 1 0 0 | 1 1 0 0 |
| 15 | 1 1 0 0 | 0 1 1 0 | 0 0 1 1 | 0 0 0 1 | 0 0 0 1 |

The above table shows how one can determine all LFSR states from the first k (in this case 4) generated binary symbols. One can see that at moment 15 the LFSR repeats the states. One can also see that after the first k (in the example k=4) symbols all other generated symbols are pre-determined. In fact, one can generate the symbols of the sequence in sync with a received sequence by applying the calculated output states using the values of the first 4 generated symbols.

The states of an LFSR at a certain moment can be determined by using the states as shown above an taking the AND of the symbols with the expression of the states.

The sequence as generated by the binary generator of FIG. 1 and received may be [1 1 0 1 0 1 1 0 0 1 0 0 0 1 1 1 1 0 1 0 1 1 0 0 1 0 0 0 1 1 . . . ]. The first 4 symbols are [1 1 0 1]. Keeping in mind that the generated symbols are represented as [d c b a] one has to apply [d c b a]=[1 0 1 1]. In accordance with an aspect of the present invention the initial state of an LFSR that generates the sequence is [1 1 0 0] [0 1 1 0] [0 0 1 1] [0 0 0 1] combined with AND of [1 0 1 1], leading to {[1 1 0 0] AND [1 0 1 1]}, {[0 1 1 0] AND [1 0 1 1]}, {[0 0 1 1] AND [1 0 1 1]}, {[0 0 0 1] AND [1 0 1 1]}. This leads to: [1 0 1 1], [0 0 1 0], [0 0 1 1] and [0 0 0 1]. By evaluating the XOR of the bits of each shift register state one gets: [1], [1], [0], [1]. Accordingly, the initial LFSR state is [1 1 0 1].

In a similar way a circuit can determine any symbol of the sequence. For instance the 4 consecutive symbols generated after the first 4 symbols are [1 0 0 1], [1 0 1 1] [1 1 1 1] and [0 1 1 1], wherein again the positions of the bits indicate [d c b a]. With [d c b a]=[1 0 1 1] a circuit or an expression can evaluate to {[1 0 0 1] AND [1 0 1 1]}, {[1 0 1 1] AND [1 0 1 1]}, {[1 1 1 1] AND [1 0 1 1]}, and {[0 1 1 1] AND [1 0 1 1]}. This leads to: [1 0 0 1], [1 0 1 1], [1 0 1 1] and [0 0 1 1]. Evaluating the XOR of the bits of a state leads to [0], [1], [1] and [0], which are of course the symbols as generated in the sequence.

As illustrative examples, states and generated symbols of an LFSR circuit have been determined based on k received n-state symbols in a received sequence wherein k is at least equal to the number of shift register elements in an LFSR associated with the sequence. It is actually not required that the at least k received symbols that are used to determine a synchronization state are symbols that are consecutive in a sequence. To illustrate this aspect assume again a binary sequence generator as shown in FIG. 1. Assume that for some reasons (of which one will be provided later) symbols generated on non consecutive moments are available. For instance of the repeating m-sequence [1 1 0 1 0 1 1 0 0 1 0 0 0 1 1 1 1 0 1 0 1 1 0 0 1 0 0 0 1 1 . . . ] only symbols that are spaced 3 symbols apart are available. Intervening symbols are not available. However, it is known that the available symbols are spaced 3 symbols.

To determine the states one can use the state based table of LFSR states at least 15 moments as provided above. Assume that 4 symbols are available: at moments init, 4, 8 and 12. Assume that the initial state of the LFSR at moment init is [u 0 0 0], [0 v 0 0], [0 0 w 0] and [0 0 0 z]. The generated symbols are: at t=init symbol a; at t=4 symbol b; at t=8 symbol c and at t=12 symbol d.

The table shows that a=[0 0 0 1], b=[1 1 1 0], c=[1 0 1 1] and d=[0 0 1 0]. Writing out the equations leads to:

$$z=a;$$

$$w=d;$$

$$u=c+w+z=c+d+a;\text{ and}$$

$$b=u+v+w \rightarrow v=b+u+w=b+c+d+a+d=c+b+a.$$

This thus lead to initial LFSR state [u 0 0 0] [0 v 0 0] [0 0 w 0] [0 0 0 z] represented as [1 1 0 1] [0 1 1 1] [1 0 0 0] [0 0 0 1] in terms of [d c b a].

One can check this by determining the init, t=4, t=8 and t=12 symbols in [1 1 0 1 0 1 1 0 0 1 0 0 0 1 1 1 1 0 1 0 1 1 0 0 1 0 0 0 1 1 . . . ], which are [1], [0], [0] and [0], or [d c b a]=[0 0 0 1]. The initial state of the LFSR thus with [d c b a]=[0 0 0 1] can be evaluated by a circuit or an expression can evaluate to {[1 1 0 1] AND [0 0 0 1]}, {[0 1 1 1] AND [0 0 0 1]}, {1[1 0 0 0] AND [0 0 0 1]}, and {[0 0 0 1] AND [0 0 0 1]}. This leads to: [0 0 0 1], [0 0 0 1], [0 0 0 0] and [0 0 0 1]. Evaluating the XOR of the bits of a state leads to [1], [1], [0] and [1], which is the initial state of the LFSR [1 1 0 1] to generate the sequence.

On the basis of the above a circuit can determine an initialization content for a moment defined by the receipt of the first symbol. In that case the initial state (for instance at moment 15) can be evaluated based on the received symbols and initiated at the right time. One can also generate all following symbols in sync with the received symbols based on the evaluated k symbols.

In a further embodiment one can express all states (and generated symbols) in terms of the k symbols received on non-consecutive moments. The table representing the states and generated symbols as a function of k non-consecutive received symbols is provided below.

| non-consecutive symbol based | SR1 | SR2 | SR3 | SR4 | SG |
|---|---|---|---|---|---|
| init | 1 1 0 1 | 0 1 1 1 | 1 0 0 0 | 0 0 0 1 | 0 0 0 1 |
| 1 | 0 0 0 1 | 1 1 0 1 | 0 1 1 1 | 1 0 0 1 | 1 0 0 1 |
| 2 | 1 0 0 1 | 0 0 0 1 | 1 1 0 1 | 1 1 1 0 | 1 1 1 0 |
| 3 | 1 1 1 0 | 1 0 0 1 | 0 0 0 1 | 0 0 1 1 | 0 0 1 1 |
| 4 | 0 0 1 1 | 1 1 1 0 | 1 0 0 1 | 0 0 1 0 | 0 0 1 0 |
| 5 | 0 0 1 0 | 0 0 1 1 | 1 1 1 0 | 1 0 1 1 | 1 0 1 1 |
| 6 | 1 0 1 1 | 0 0 1 0 | 0 0 1 1 | 0 1 0 1 | 0 1 0 1 |
| 7 | 0 1 0 1 | 1 0 1 1 | 0 0 1 0 | 0 1 1 0 | 0 1 1 0 |
| 8 | 0 1 1 0 | 0 1 0 1 | 1 0 1 1 | 0 1 0 0 | 0 1 0 0 |
| 9 | 0 1 0 0 | 0 1 1 0 | 0 1 0 1 | 1 1 1 1 | 1 1 1 1 |
| 10 | 1 1 1 1 | 0 1 0 0 | 0 1 1 0 | 1 0 1 0 | 1 0 1 0 |
| 11 | 1 0 1 0 | 1 1 1 1 | 0 1 0 0 | 1 1 0 0 | 1 1 0 0 |
| 12 | 1 1 0 0 | 1 0 1 0 | 1 1 1 1 | 1 0 0 0 | 1 0 0 0 |
| 13 | 1 0 0 0 | 1 1 0 0 | 1 0 1 0 | 0 1 1 1 | 0 1 1 1 |
| 14 | 0 1 1 1 | 1 0 0 0 | 1 1 0 0 | 1 1 0 1 | 1 1 0 1 |
| 15 | 1 1 0 1 | 0 1 1 1 | 1 0 0 0 | 0 0 0 1 | 0 0 0 1 |

The above table shows all possible binary state expressions based on a symbol [0 0 0 z] generated at moment init; [0 0 w 0] at moment 4; [0 v 0 0] at moment 8 and [u 0 0 0] at moment 12. The content of a 4-element shift register that is synchronous with the received symbols at moment 14 is thus [0*u+1*v+1*w+1*z]; [1*u+0*v+0*w+0*z]; [1*u+1*v+0*w+0*z]; and [1*u+1*v+0*w+1*z]. The coefficients of the equations as shown in the table can be stored in a memory and retrieved for execution. Execution can be as simple as determining the AND between the retrieved coefficient word and the received 4 symbols and summing (XOR) the individual results to determine the required state of a shift register element.

One should keep in mind that an n-state LFSR of length k associated sequence is cyclic. The state at moment i is the same as for instance i+($n^k-1$).

As stated before, one may store all states, either as a function of an initial starting state or as a function of received symbols to calculate an initialization setting of an LFSR for a moment to follow a predetermined number of pulses after receiving at least k symbols of a sequence wherein the zero moment is determined by a first symbol of the sequence. A circuit can also calculate the to be generated n-state symbols. It is clear that the moment of start of synchronization of an LFSR requires at least one initialization. Based on conditions of a channel one may want to skip the initialization to a later moment. This can be based on already calculated initialization, wherein one just retrieves another initialization setting from for instance a memory, or if other symbols will be received one may restart the initialization. In fact, only a limited number of initialization settings will be required. Thus storing such settings in a memory may require a limited number of memory elements.

One may thus store at least one set of k shift register settings, based on received symbols. It is also possible to store for instance k consecutive settings of for instance the first shift register element. One can see from any one of the above state tables that with 4 consecutive first states for instance of moment 3, 4, 5 and 6 all second third and fourth states are determined. For instance the fourth state of moment 5 is identical to the first state at moment 6. The second state of moment 5 is the first state of moment 4 and the third state of moment 5 is the first state of moment 3. This simple substitution allows a reconstruction of all states based on k stored first states.

Despite the above, a preferred embodiment is to have a representation of an initial state stored and retrieved from a memory or implemented in a circuit so that the values of k received symbols will provide the correct initial setting of a sequence generator at a desired moment $t_{sync}$.

Figure 5:
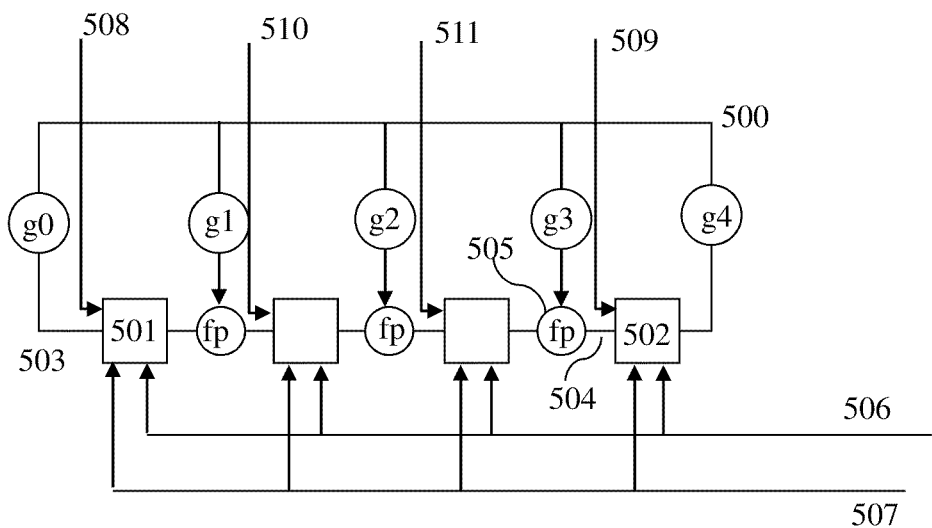
FIGS. 5-8 illustrate an LFSR with state corrective capabilities in accordance with an aspect of the present invention.

The new state of an LFSR may have to be entered into the shift register at a moment $t_{sync}$. It is assumed that the correct LFSR state for moment $t_{sync}$ has been determined for instance in accordance with an aspect of the present invention. A next step is then to make sure that the new state is entered at the correct time. This is illustrated in a first embodiment in diagram of FIG. 5. An LFSR 500 has k=4 shift register elements of which the first element 501 and last element 502 have been identified. The feedback into the LFSR takes place through n-state inverters g0, g1, g2, g3 and g4. In the binary example g0=1, g1=0, g1=0, g2=0, g3=1 and g4=1. In the binary case an inverter 0 means an open connection and an inverter 1 means a connection, so no actual multiplication or inversion takes place.

Signals are modified if required by a binary function fp, which may be the XOR function. Because in this example g1=0, g1=0 and g2=0, or these taps being open connections the functions fp connected to these taps do not perform any unique function as they merely pass on the signal of a preceding shift register element and they can be omitted in an actual circuit or implementation. The signal generated from element 502 is thus fed back to element 501 at input 503 and to implementation 505 of function fp at the input 504 of 502. The LFSR works under clock 506 which enables each shift register element to store the signal at its input.

In one embodiment each shift register element is also provided with a clock signal 507. Clock 506 and 507 may have the property that only one of these clock signals is active at the same time and thus are mutually exclusive. Each clock enables a shift register element to receive a signal from a related input. For instance, clock 506 enables element 501 to store the signal at input 503, while clock 507 enables a signal on input 508 to be stored in 501. The same applies to element 502. Clock 506 enables the signal on 504 to be stored in 502, while 507 enables a signal on 509 to be stored in 502.

By enabling 507 at the right time, while not enabling 506 on or around moment $t_{sync}$ and by providing signals related to the newly synchronized state on inputs 508 through 509 to the shift register elements, allows the updating and synchronization of the shift register. The inputs 510 and 511 under control of 507 are applied to the second and third shift register element respectively.

It is contemplated that at a receiving side an LFSR is operating that requires to be updated in its states to be synchronized with a received sequence. This can be done by replacing a content of shift register elements with a new state. In a further embodiment one may modify a content of s shift register at a moment $t_{sync}$ by a signal that will cause the LFSR to be in sync. The challenge is then to determine how the content should be modified. In one embodiment one receives the k symbols and determines in accordance with an aspect of the present invention the new state. A circuit can also determine generated output signals of the LFSR at the same moment that the k symbols are received. This allows a circuit identical to that determines the new state of the LFSR to predict what the actual state of the LFSR would be at $t_{sync}$. Because it is known what the state of a shift register should be at $t_{sync}$ and what it is going to be if unmodified at $t_{sync}$ it is easy to determine how the actual state should be modified to be in the correct modified state. For instance if shift register element 501 is desired to be in synchronized state $a_{sync}$ while it is also predicted that 501 is going to be in actual state $a_{act}$, then it is easy to see in the binary case that one should add or XOR a corrective signal $a_{cor}=a_{act}$ XOR $a_{sync}$ to actual state $a_{act}$. The final state is then State=$a_{act}$ XOR $a_{cor}=a_{act}$ XOR $a_{act}$ XOR $a_{sync}=a_{sync}$. This is of course the desired state.

Figure 6:
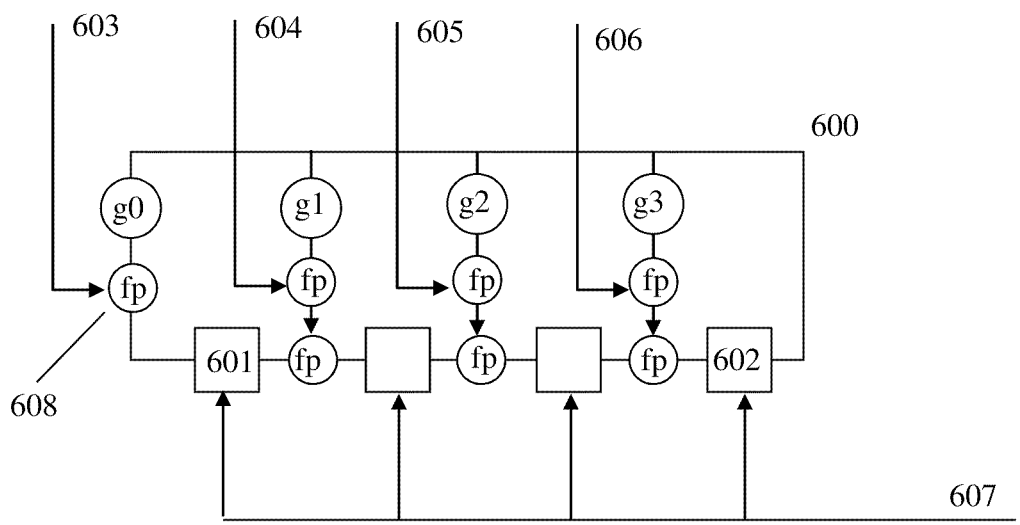

A diagram of one embodiment to achieve such an update of state is provided in FIG. 6 with an n-state LFSR 600 with inverters g0, g1, g2 and g3. The function fp of which one 608 is identified herein are n-state adders over GF(n). Configurations with different functions are also contemplated. Shift register elements 601 and 602 are identified. The LFSR works under a clock 607. Only at correct moment $t_{sync}$ or a related period are calculated corrective signals provided on inputs 603, 604, 605 and 606 respectively. At all other times the corrective signals are set to represent symbol zero. This ensures that only at moment $t_{sync}$ a corrective signal is processed (as a symbol 0 does not change an output of fp when fp is an adder over GF(n)).

Figure 7:
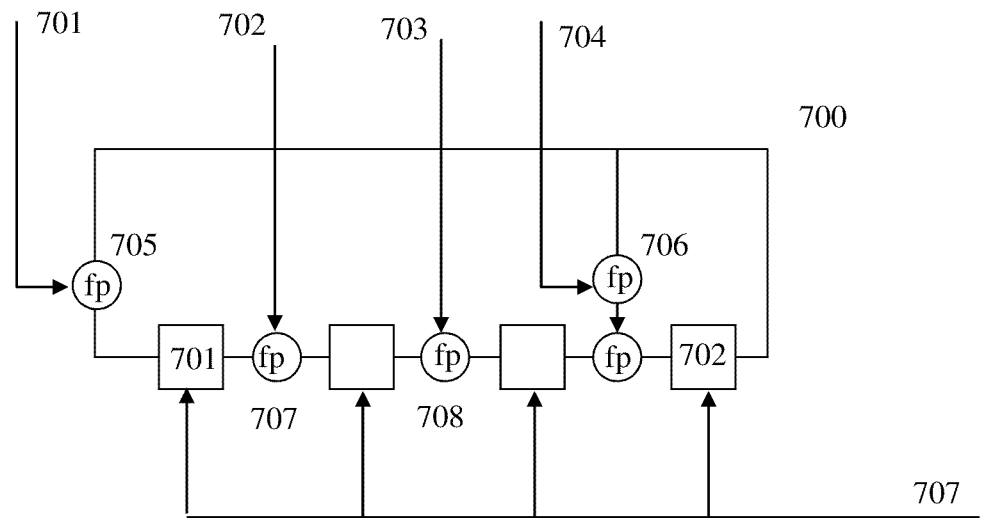

A diagram of the binary configuration is shown in FIG. 7. The LFSR 700 has additional functions fp 705 and 706 in feedback taps to enable XORing of inputs 701 and 704 with corrective signals with the feedback. Furthermore, functions fp 707 and 708 between shift register elements are provided to enable XORing of corrective signals on inputs 702 and 703 respectively. A clock signal 707 is provided.

Figure 8:
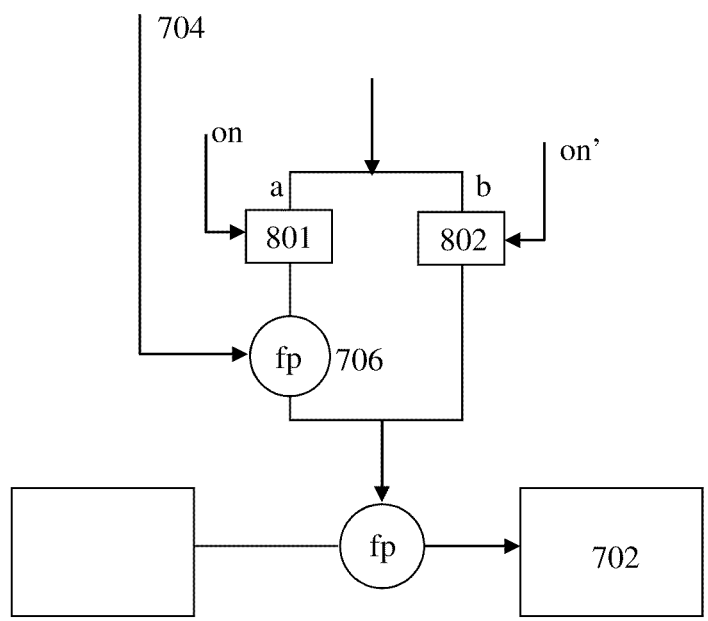

The insertion of function 707 and 708 do not affect the speed of the LFSR. However, the insertion of function fp 705 and 706 can potentially affect the speed of the LFSR and certainly the power consumption. This is because the functions fp 705 and 706 have first to be executed before other functions can be executed. One can limit the effect of 705 and 706 in an embodiment as shown in FIG. 8. The function fp 706 with corrective input 704 for instance is placed in a path 'a' that is enabled when a switch 801 is closed by a signal ON and a switch 802 is open. When the signal ON is not present (or ON') switch 801 is open and 802 is closed enabling a path 'b' that has no additional function fp.

Figure 3:
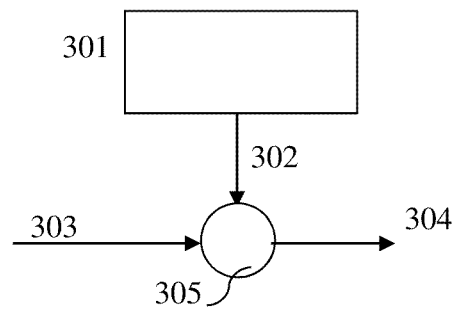
FIG. 3 is a diagram of an n-state scrambler/descrambler using an autonomous n-state sequence generator.

A reason for using non-consecutive symbols in a received sequence is the application of an LFSR based sequence generator in a scrambler and a corresponding descrambler. A diagram of a scrambler/descrambler is provided in FIG. 3. A sequence generator 301, which may be an LFSR associated sequence generator provides a sequence of n-state symbols on an input 302 of a scrambling/descrambling device 305 which implements a reversible n-state function 'sc'. A second input 303 provides another sequence of n-state symbols. A scrambled or descrambled sequence is provided on output 304. In the binary case 305 implements a self reversing function such as a XOR function. This means that the scrambler and descrambler both implement a XOR function in 305. This is not always the case for n>2. For instance a reversible but not self reversing n-state function 'sc' is used in a scrambler. The descrambler has to implement the descrambling function 'ds' which reverses 'sc'. For instance in the 4-state case, 'sc' can be the modulo-4 addition function. The reversing function then is 'ds' being the modulo-4 subtraction function.

In order for the descrambler to correctly descramble, the sequence provided on input 302 has to be in sync with input 302 at the descrambling side. In some cases (such as in Distributive Sample Scramblers) samples of the sequence generated by the sequence generator are transmitted to the descrambler.

Samples of the generated sequence can be transmitted over a separate channel. They can also be made part of a transmitted sequence by reserving a dedicated slot in a signal frame for sequence samples. A receiving apparatus will know when such a slot in a frame occurs, for instance by use of a specific header, and can process the samples after receipt. The simplest way to include sample is by using a known pattern in the to be scrambled sequence. For instance when scrambled against all zero symbols the scrambled symbols are identical to the symbols provided by the sequence generator.

It should be clear that based on these samples which should have at least the same number of symbols in total as the number of shift register elements can be applied in accordance with methods and apparatus provided herein to synchronize the sequence generator of the descrambler. A sequence generator associated with an LFSR of k shift register elements can thus be synchronized after receiving k symbols that represent the generated sequence. As was shown above, these symbols do not need to be consecutive.

Figure 2:
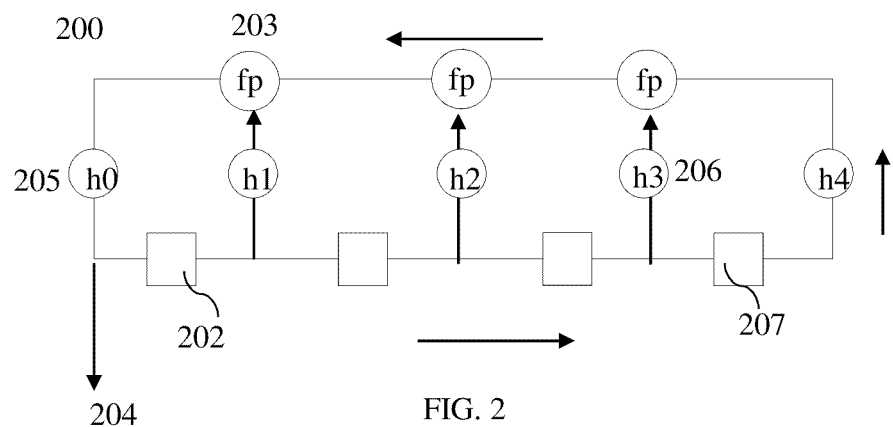

The examples provided are based on binary LFSRs in Galois configuration. Galois LFSRs are in general (with more than 1 feedback tap) faster than an LFSR as provided in Fibonacci configuration. A diagram of an n-state Fibonacci LFSR 200 is shown in FIG. 2. The LFSR 200 has k=4 shift registers. The taps are defined by n-state inverters [h0 h1 h2 h3 h4]. In general, one may assume h4 to be a straight through connection. The inverters may be multipliers over GF(n). In the binary case the inverters are in general either 1 (a connection) or 0 (open connection or interrupted connection). A sequence of generated n-state symbols may be generated on output 204. Shift register elements 202 and 207 are identified. Each of the shift register elements can receive, store and provide an n-state signal or a plurality of signals representing an n-state symbol with n≥2. Feedback takes place through an implementation of an n-state logic function fp of which 203 is identified in FIG. 2. Feedback inverters 205 (h0) and 206 (h3) are also identified. These inverters may be any n-state inverters, but preferably n-state reversible inverters. For convenience of calculations, the n-state inverters are assumed to be multipliers over GF(n). In the binary case for convenience an inverter is 0 (open connection) or 1 (connection). In the binary case h0=1. In the binary case function fp is generally either the XOR or EQUAL function to generate an m-sequence. The circuit is under control of a clock signal which is not shown but is assumed.

Figure 9:
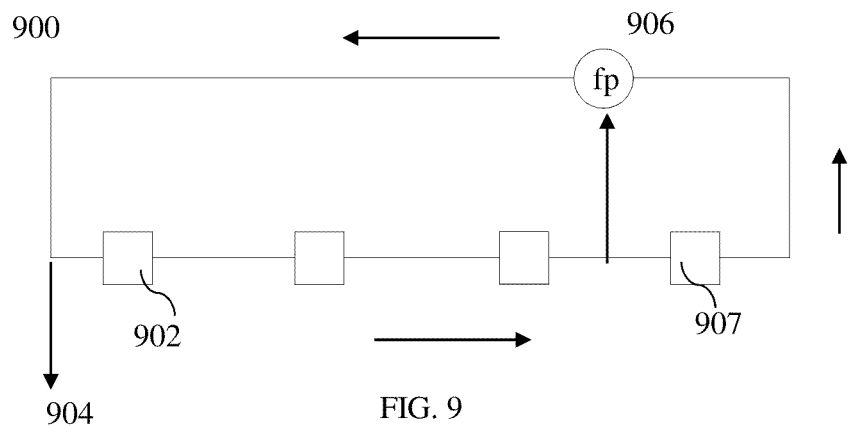
FIG. 9 is a diagram of an LFSR.

FIG. 9 shows a diagram of a binary m-sequence generator 900 of a repetitive binary m-sequence of 15 symbols generated on 904 by a 4-state binary LFSR of which elements 902 and 907 are identified. The feedback function fp identified as 906 can be a XOR or an EQUAL function. The following table shows the consecutive states of the shift register elements as a function of the initial states after a shift starting with initial state [1 0 0 0]; [0 1 0 0]; [0 0 1 0]; and [0 0 0 1] for the 4 shift register elements using fp is XOR.

| state based Fib. LFSR | SR1 | SR2 | SR3 | SR4 | SG |
|---|---|---|---|---|---|
| init | 1 0 0 0 | 0 1 0 0 | 0 0 1 0 | 0 0 0 1 | 1 0 0 0 |
| 1 | 0 0 1 1 | 1 0 0 0 | 0 1 0 0 | 0 0 1 0 | 0 0 1 1 |
| 2 | 0 1 1 0 | 0 0 1 1 | 1 0 0 0 | 0 1 0 0 | 0 1 1 0 |
| 3 | 1 1 0 0 | 0 1 1 0 | 0 0 1 1 | 1 0 0 0 | 1 1 0 0 |
| 4 | 1 0 1 1 | 1 1 0 0 | 0 1 1 0 | 0 0 1 1 | 1 0 1 1 |
| 5 | 0 1 0 1 | 1 0 1 1 | 1 1 0 0 | 0 1 1 0 | 0 1 0 1 |
| 6 | 1 0 1 0 | 0 1 0 1 | 1 0 1 1 | 1 1 0 0 | 1 0 1 0 |
| 7 | 0 1 1 1 | 1 0 1 0 | 0 1 0 1 | 1 0 1 1 | 0 1 1 1 |
| 8 | 1 1 1 0 | 0 1 1 1 | 1 0 1 0 | 0 1 0 1 | 1 1 1 0 |
| 9 | 1 1 1 1 | 1 1 1 0 | 0 1 1 1 | 1 0 1 0 | 1 1 1 1 |
| 10 | 1 1 0 1 | 1 1 1 1 | 1 1 1 0 | 0 1 1 1 | 1 1 0 1 |
| 11 | 1 0 0 1 | 1 1 0 1 | 1 1 1 1 | 1 1 1 0 | 1 0 0 1 |
| 12 | 0 0 0 1 | 1 0 0 1 | 1 1 0 1 | 1 1 1 1 | 0 0 0 1 |
| 13 | 0 0 1 0 | 0 0 0 1 | 1 0 0 1 | 1 1 0 1 | 0 0 1 0 |
| 14 | 0 1 0 0 | 0 0 1 0 | 0 0 0 1 | 1 0 0 1 | 0 1 0 0 |
| 15 | 1 0 0 0 | 0 1 0 0 | 0 0 1 0 | 0 0 0 1 | 1 0 0 0 |

The column SG shows the generated symbols as a function of the initial states. It shows that the states repeat after 15 shifts. A circuit can now determine all states and generated symbols after receiving 4 generated symbols.

Figure 10:
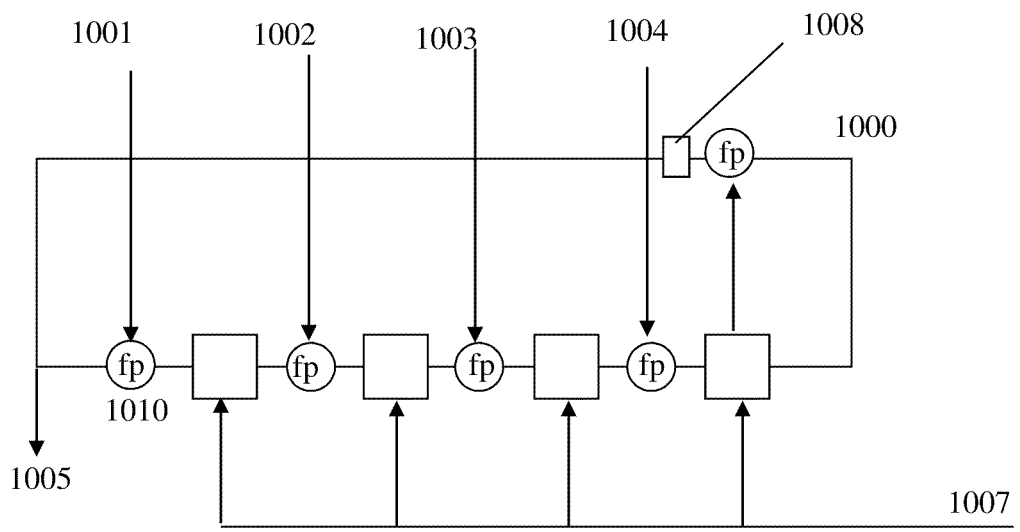
FIG. 10 is a diagram of an LFSR in accordance with an aspect of the present invention.

One can apply the same or at least similar circuits as provided above to determine synchronization of a sequence generator at a receiving side. One can also determine a corrective sequence to be entered into the shift register at a moment $t_{sync}$ to synchronize the LFSR with a transmitting side. This is illustrated in FIG. 10 with an LFSR 1000. The shift register is provided with devices implemented function fp (XOR for instance) of which 1010 is identified. A clock signal 1007 is also identified. The devices have inputs 1001, 1002, 1003 and 1004 respectively which are provided with corrective signals at the correct moment. A switch 1008 may be applied to disable feedback at the moment of update. After update a synchronized sequence is provided on 1005.

Non-Binary N-State LFSR

In order to demonstrate the apparatus and methods as provided above for n>2 as an illustrative example an 8-state case with the 8-state Galois configuration [g0 g1 g2 g3 g4]=[4 2 1 2 1] of FIG. 1 will be applied to generate an 8-state m-sequence of 4095 of 8-state symbols. The inverters are multipliers over GF(8) and the function fp are the addition over GF(8) whereof the truth tables are also provided above. This sequence has 4095 8-state symbols before it repeats itself. For illustrative purposes only, 25 consecutive states of the LFSR will be provided. However, it should be clear that all states can be generated easily.

The following table provides the first 25 consecutive states of the LFSR and the generated symbols as a function of an initial LFSR state [1 0 0 0]; [0 1 0 0]; [0 0 1 0] and [0 0 0 1]. The initial state generates symbol [0 0 0 1].

| Galois LFSR register states | SR1 | SR2 | SR3 | SR4 | GS |
|---|---|---|---|---|---|
| int | 1 0 0 0 | 0 1 0 0 | 0 0 1 0 | 0 0 0 1 | 0 0 0 1 |
| 1 | 0 0 0 4 | 1 0 0 2 | 0 1 0 1 | 0 0 1 2 | 0 0 1 2 |
| 2 | 0 0 4 5 | 0 0 2 6 | 1 0 1 0 | 0 1 2 7 | 0 1 2 7 |
| 3 | 0 4 5 3 | 0 2 6 6 | 0 1 0 2 | 1 2 7 1 | 1 2 7 1 |
| 4 | 4 5 3 4 | 2 6 6 5 | 1 0 2 5 | 2 7 1 0 | 2 7 1 0 |
| 5 | 5 3 4 0 | 6 6 5 4 | 0 2 5 5 | 7 1 0 5 | 7 1 0 5 |
| 6 | 3 4 0 1 | 6 5 4 6 | 2 5 5 7 | 1 0 5 1 | 1 0 5 1 |
| 7 | 4 0 1 4 | 5 4 6 4 | 5 5 7 5 | 0 5 1 6 | 0 5 1 6 |
| 8 | 0 1 4 2 | 4 6 4 5 | 5 7 5 3 | 5 1 6 4 | 5 1 6 4 |
| 9 | 1 4 2 7 | 6 4 5 3 | 7 5 3 7 | 1 6 4 2 | 1 6 4 2 |
| 10 | 4 2 7 5 | 4 5 3 1 | 5 3 7 5 | 6 4 2 1 | 6 4 2 1 |
| 11 | 2 7 5 4 | 5 3 1 3 | 3 7 5 0 | 4 2 1 3 | 4 2 1 3 |
| 12 | 7 5 4 6 | 3 1 3 0 | 7 5 0 0 | 2 1 3 4 | 2 1 3 4 |
| 13 | 5 4 6 7 | 1 3 0 1 | 5 0 0 4 | 1 3 4 5 | 1 3 4 5 |
| 14 | 4 6 7 1 | 3 0 1 2 | 0 0 4 6 | 3 4 5 3 | 3 4 5 3 |
| 15 | 6 7 1 6 | 0 1 2 2 | 0 4 6 5 | 4 5 3 3 | 4 5 3 3 |
| 16 | 7 1 6 6 | 1 2 2 3 | 4 6 5 5 | 5 3 3 7 | 5 3 3 7 |
| 17 | 1 6 6 3 | 2 2 3 5 | 6 5 5 1 | 3 3 7 6 | 3 3 7 6 |
| 18 | 6 6 3 2 | 2 3 5 1 | 5 5 1 1 | 3 7 6 3 | 3 7 6 3 |
| 19 | 6 3 2 6 | 3 5 1 1 | 5 1 1 7 | 7 6 3 2 | 7 6 3 2 |
| 20 | 3 2 6 5 | 5 1 1 4 | 1 1 1 4 | 6 3 2 1 | 6 3 2 1 |
| 21 | 2 6 5 4 | 1 1 4 3 | 1 7 4 2 | 3 2 1 1 | 3 2 1 1 |
| 22 | 6 5 4 4 | 1 4 3 1 | 7 4 2 7 | 2 1 1 0 | 2 1 1 0 |
| 23 | 5 4 4 0 | 4 3 1 4 | 4 2 7 1 | 1 1 0 7 | 1 1 0 7 |
| 24 | 4 4 0 3 | 3 1 4 1 | 2 7 1 5 | 1 0 7 0 | 1 0 7 0 |

The representation means that the initial state is [u 0 0 0], [0 v 0 0], [0 0 w 0] and [0 0 0 z]. A number representation herein indicates the coefficient of an n-state switching expression. For instance, [1 0 0 0] represents 1*u+0*v+0*w+0*z as an expression over GF(8) with + being the addition over GF(8) and * being the multiplication over GF(8). These operations are commutative, associative and distributive. Furthermore a+a in GF(8) is 0. And + over GF(8) is self reversing. This all makes processing of symbols to determine synchronization states very simple. However, the use of other reversible n-state functions and reversible n-state inverters is also possible to generate an m-sequence and to determine synchronization states. How to reverse these functions and inverters is described by the inventor in U.S. patent application Ser. No. 11/566,725 filed on Dec. 5, 2006 which is incorporated herein by reference in its entirety.

The state [4 4 0 3] of the first shift register element at moment 24 thus represents an 8-state expression 4*u+4*v+0*w+3*z over GF(8).

Assume that one receives 4 consecutive 8-state symbols 6, 5, 4 and 3 that are part of a sequence generated by the 8-state sequence generator of FIG. 1 with the settings as provided above. One may say that a=6=[0 0 0 1]; b=5=[0 0 1 2]; c=4=[0 1 2 7] and d=3=[1 2 7 1]. This leads to the following expressions:

$$a=0+0+0+z;$$

$$b=0+0+w+2*z;$$

$$c=0+v+2*w+7*z; \text{ and}$$

$$d=u+2*v+7*w+z.$$

The reverse of multiplying with 2 in GF(8) is 7; the reverse of 3 is 6; the reverse of 4 is 5; the reverse of 5 is 4; the reverse of 6 is 3; the reverse of 7 is 2 and the reverse of 1 is 1. Using the truth tables of addition and multiplication over GF(8) as provided above leads to:

$$u=2*a+1*b+2*c+1*d \text{ or } [2\ 1\ 2\ 1];$$

$$v=1*a+2*b+1*c+0*d \text{ or } [1\ 2\ 1\ 0];$$

$$w=2*a+1*b+0*c+0*d \text{ or } [2\ 1\ 0\ 0]; \text{ and}$$

$$z=1*a+0*b+0*c+0*d \text{ or } [1\ 0\ 0\ 0].$$

With [a b c d]=[6 5 4 3] the initial state of the LFSR should thus be:

$$u=(2*6+1*5+2*4+1*3)=7+5+5+3=7+0+3=1;$$

$$v=(1*6+2*5+1*4+0*3)=6+6+4+0=4;$$

$$w=(2*6+1*5+0*4+0*3)=7+5=4; \text{ and}$$

$$z=a=6.$$

One can then generate a shift register table wherein the initial state is represented as [2 1 2 1] [1 2 1 0] [2 1 0 0] and [1 0 0 0], wherein the positions represent [a b c d] being the first 4 generated s8-state symbols from the initial state. The following table shows the first 10 states of an 8-state k-stage LFSR expressed as the first k generated 8-state symbols.

| SG based Gal. LFSR | SR1 | SR2 | SR3 | SR4 | SG |
|---|---|---|---|---|---|
| init | 2 1 2 1 | 1 2 1 0 | 2 1 0 0 | 1 0 0 0 | 1 0 0 0 |
| 1 | 4 0 0 0 | 0 1 2 1 | 0 2 1 0 | 0 1 0 0 | 0 1 0 0 |
| 2 | 0 4 0 0 | 4 2 0 0 | 0 0 2 1 | 0 0 1 0 | 0 0 1 0 |
| 3 | 0 0 4 0 | 0 4 2 0 | 4 2 1 0 | 0 0 0 1 | 0 0 0 1 |
| 4 | 0 0 0 4 | 0 0 4 2 | 0 4 2 1 | 4 2 1 2 | 4 2 1 2 |
| 5 | 7 5 4 5 | 5 3 2 6 | 4 2 2 0 | 5 6 0 7 | 5 6 0 7 |
| 6 | 1 2 0 3 | 2 4 4 6 | 0 4 2 2 | 3 6 2 1 | 3 6 2 1 |
| 7 | 6 2 5 3 | 2 6 3 5 | 5 3 1 5 | 4 5 5 0 | 4 5 5 0 |
| 8 | 7 1 1 0 | 1 7 1 4 | 1 1 2 5 | 0 4 5 5 | 0 4 5 5 |
| 9 | 0 7 1 1 | 7 6 5 6 | 1 5 6 7 | 1 6 7 1 | 1 6 7 1 |

One can also express the states as a function of 4 non-consecutive symbols. Whatever approach is taken, it should be clear that in an m-sequence generator each state for $n^k-1$ symbols in a row and in a column of the table are unique. That is, no state expressed as an expression of initial states appears more than once in a column of states, or in the same row. This allows the unique identification of a state. It is to be understood that this "uniqueness" of states applies to the expression of the state. The actually evaluated state of a symbol or a content of a related shift register may not be unique. It is however, again, emphasized that each of the total shift register states of k n-state symbols in k shift register elements of a k-element LFSR that generates an n-state m-sequence is unique, before being repeated.

Because the expressed states are unique, one can use for instance an addressable memory as provided in FIG. 4 wherein a generated symbol associated with a k-state n-state LFSR is uniquely defined by an address formed by k n-state symbols generated by a generator. One important criterion for synchronization is from what address to start generating symbols at a certain moment $t_{sync}$. The above methods and apparatus provide the tools to calculate such an address or setting of an LFSR.

In the above example 4 consecutively generated 8-state symbols were used to calculate an initial state. The states where further recoded into a representation using the generated symbols as the determining elements. One can apply the same approach to non-consecutively received n-state symbols. For instance, assume that 4 symbols were received (sampled) 2 symbols apart being 6, 5, 4 and 3. Set the first symbol to be generated at moment int, and others at moment 3, 6 and 9. The following table shows all LFSR states and generated 8-state symbols as a function of 4 non-consecutively generated 8-state symbols as received by a receiver.

| SG based Gal. LFSR | SR1 | SR2 | SR3 | SR4 | SG |
|---|---|---|---|---|---|
| int | 5 7 0 3 | 4 4 2 1 | 2 3 4 6 | 1 0 0 0 | 1 0 0 0 |
| 1 | 4 0 0 0 | 3 7 0 3 | 2 4 2 1 | 0 3 4 6 | 0 3 4 6 |
| 2 | 0 6 7 2 | 4 4 5 7 | 3 1 4 4 | 2 0 3 3 | 2 0 3 3 |
| 3 | 5 0 6 6 | 3 6 5 1 | 1 4 2 1 | 0 1 0 0 | 0 1 0 0 |
| 4 | 0 4 0 0 | 5 2 6 6 | 3 5 5 1 | 1 1 2 1 | 1 1 2 1 |
| 5 | 4 4 5 4 | 2 1 3 2 | 6 4 7 5 | 5 3 2 4 | 5 3 2 4 |
| 6 | 1 6 5 7 | 3 0 2 7 | 3 7 5 1 | 0 0 1 0 | 0 0 1 0 |
| 7 | 0 0 4 0 | 1 6 3 7 | 3 0 4 7 | 3 7 3 1 | 3 7 3 1 |
| 8 | 6 3 6 4 | 4 1 0 2 | 7 2 0 3 | 6 1 0 6 | 6 1 0 6 |
| 9 | 2 4 0 2 | 2 5 6 5 | 3 0 0 7 | 0 0 0 1 | 0 0 0 1 |
| 10 | 0 0 0 4 | 2 4 0 0 | 2 5 6 6 | 3 0 0 6 | 3 0 0 6 |
| 11 | 6 0 0 2 | 4 0 0 5 | 5 4 0 6 | 1 5 6 2 | 1 5 6 2 |

Using this table one can, for instance, calculate the symbol (or the LFSR state) on moment 11. The 8-state symbol on moment 11 is determined by the expression sym=1*a+5*b+6*c+2*d wherein a=6 generated at moment int, b=5 generated at moment 3, c=4 generated at moment 6 and d=3 generated at moment 9, which allows a circuit implementing functions multiplication and addition over GF(8) to calculate all states and generated symbols. One may also use the intermediary step of calculating the initial LFSR state at moment int for instance and use the earlier table to determine the symbol to be generated at moment 11.

As before, one can determine all states based on the expressions for the received symbols, which can be named [0 0 0 v]; [0 0 w 0]; [0 x 0 0]; and [y 0 0 0]. By using the earlier state tables one can thus create the equations:

$$0+0+0+d=v;$$

$$a+2b+7c+d=w;$$

$$a+5c+0+d=x; \text{ and}$$

$$a+6b+4c+2v=y.$$

By solving the above equations one will get:

$$d=v;$$

$$c=2v+3w+4x+6y;$$

$$b=4v+4w+2x+y; \text{ and}$$

$$a=5v+7w+0+3y.$$

One can then create the new state expression table by substitution, for instance. Such a table can be stored in a memory, which indicates the coefficients with which the incoming symbols have to be multiplied or inverted in for instance a processor. Based on such a table and on the required calculation time one can then instruct a processor to synchronize at a moment $t_p$ which is p symbols after the last symbol was received. For instance, the synchronization moment can be right after the fourth symbol was received (moment 10), or any other desired moment.

It should be clear that it is not required that the symbol samples are evenly spaced. However, it is easier to locate the symbol samples if they always have the same position relative to each other in a received signal.

Using the above table one can, for instance, calculate the symbol (or the LFSR state) on moment 11. The 8-state symbol on moment 11 is determined by the expression sym=1*a+5*b+6*c+2*d wherein a=6 generated at moment int, b=5 generated at moment 3, c=4 generated at moment 6 and d=3 generated at moment 9, which allows a circuit implementing functions multiplication and addition over GF(8) to calculate all states and generated symbols. One may also use the intermediary step of calculating the initial LFSR state at moment int for instance and use the earlier table to determine the symbol to be generated at moment 11.

Figure 34:
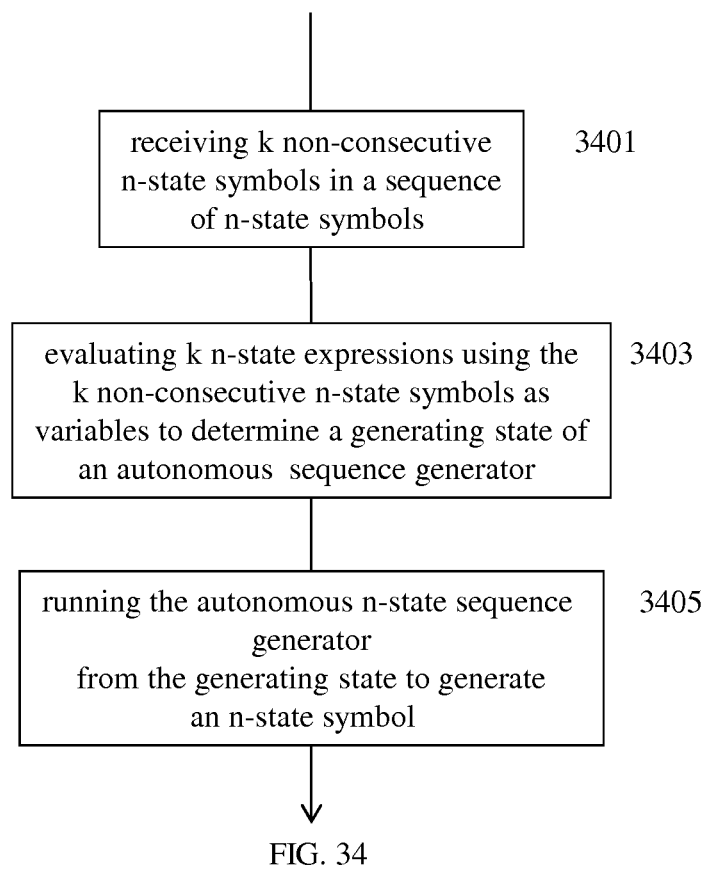
FIG. 34 illustrates steps performed in accordance with various steps of the present invention.

FIG. 34 illustrates the above steps, wherein step 3401 describes receiving the k non-consecutive n-state symbols; step 3403 describes evaluating the n-state expressions to determine individual n-state symbols of a desired generating state of the sequence generator; and step 3405 describes applying the generating state to the sequence generator to generate an n-state symbol.

An apparatus can be synchronized by generating the correct n-state symbols as of the synchronized moment. One can also synchronize an LFSR by loading the correct LFSR state corresponding to the synchronization moment. One can also add a corrective signal to a shift register content to correct the out-of-sync state at a certain moment to the correct synchronized state. The procedure or apparatus is similar to the one in the binary case as illustrated in FIG. 6. One may assume that a number of clock pulses will have to pass to allow the synchronization apparatus to generate the corrective or correct states.

In one embodiment, the apparatus receives k n-state symbols and determines the correct state on synchronization moment $t_{sync}$ which may be q clock pulses in the future. Assume that one register should have the state determined by s1*a1+s2*b1+s3*c1+s4*d1 based on received symbols a1, b1, c1, and d1. Furthermore, assume that based on locally generated symbols a2, b2, c2 and d2 the apparatus determines that at $t_{sync}$ the out-of-sync state of the local LFSR is determined by q1*a2+q2*b2+q3*c2+q4*d2. The corrective signal to put the LFSR shift register element in the correct state at $t_{sync}$ is determined by {s1*a1+s2*b1+s3*c1+s4*d1+q1*a2+q2*b2+q3*c2+q4*d2} wherein + and * are operations over GF(8) in the example, keeping in mind that subtraction in GF(8) is the same as addition as addition over GF(8) is a self reversing function.

In accordance with a further aspect of the present invention, one can predict from the table what the next sample symbol of the LFSR should be. For instance, after k sample symbols have been received related to a sequence that is based on a k-shift register element based LFSR, then the k+1 sample is fully determined. If that prediction is wrong, the LFSRs or the LFSR programs are out of sync and the synchronization process starts, for instance using the most recent sample symbol as the start of the re-sync process.

Herein, the sequences in one aspect of the present invention are related to an LFSR based sequence generator. This does not mean that the sequences actually have to be generated by an LFSR. They may also be retrieved from a memory. They may also be generated by an n-state expression that implements the LFSR for instance on a processor. However, even if the symbols are not generated by an LFSR the relations between the symbols in such a sequence can still be determined by the earlier herein provided methods.

Processor based sequence generators have an advantage in that "entering" a new state in a shift register element is achieved by calculating or retrieving that state and assigning it to the shift register element.

One known approach in synchronization is determining an offset between a current state of the decoder and a required state and adding such an offset to the current state. Such an approach is for instance disclosed in U.S. Pat. No. 5,245,661 issued on Sep. 14, 1993 to Lee et al. which is incorporated herein by reference. In a related manner "masks" are determined that can be used to update the LFSRs.

Synchronization of a sequence generator in a receiver with that of a transmitter is required for instance to make sure that a received spread spectrum signal can be correctly decoded. Accordingly, the methods and systems as disclosed herein are in accordance with an aspect of the present invention applied in or are part of a communication receiver, which is preferably a wireless receiver, and more preferably a mobile wireless communication receiver such as a mobile computing device, a PDA, a cell phone, a smart phone, an eReader, or a tablet.

The above examples are illustrated for an 8-state LFSR in Galois configuration. It should be clear that the approach also applies to Fibonacci configuration n-state LFSRs, which are fully contemplated.

The above n-state examples are based on an 8-state 4-stage LFSR with functions defined in GF(8). It should be clear that the aspects of the inventions as disclosed herein apply to k-stage n-state LFSRs with n≥2 and k≥2 and for n>2 and k>2. Switching functions applied herein are additions and multipliers over GF(n). In one embodiment $n=2^m$ with $m \geq 1$ and with m>1. This allows especially the adders to be implemented with binary XOR or EQUAL functions. However, other implementations are also contemplated. For instance, in one embodiment the addition over GF(n) can be replaced with a modulo-n addition. The addition, over GF(n) in the examples, has an inverter at least one input. Such a function can be reduced to a single function having no inverter at an input. This aspect is disclosed, for instance, in U.S. Non-Provisional patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS now U.S. Pat. No. 7,643,632 issued on Jan. 5, 2010 which is incorporated herein in its entirety. In a further embodiment reversible n-state switching or logic functions are used that do not generate a state 0, when two inputs are 0, which excludes additions. Reversible inverters in a further embodiment herein are not multipliers over GF(n).

It is again pointed out that the methods and apparatus for generated a sequence are associated with an n-state LFSR. However, no real LFSR has to be applied as each LFSR state can be expressed and evaluated by individual expressions or n-state switching expressions implemented with n-state or binary devices. It should also be clear that each state can be evaluated without first evaluating a preceding or succeeding state, which allows all states including comparative states to be determined concurrently. The methods and aspects of the present invention can be implemented in a processor. They can also be implemented in parallel processors that determine an LFSR states concurrently. A processor may be a programmable processor with a memory to store and provide instructions that perform the steps herein provided. A processor may also be customized or hard wired circuitry that performs one or more instructions. Such circuitry can be Field Programmable Gates Arrays (FPGA) circuitry for instance. The aspects of the present invention may also be provided as a set of instructions that are part of a library, which can be selected by a user to program an FPGA circuit to create a processor that performs instructions to execute aspects of the present invention.

The coefficients of the expressions may be stored in a memory. They may also be hardwired in a circuit such as a FPGA. The coefficient may also be provided in a permanent storage device such as a Read Only Memory and the like. No matter how provided, the coefficients are available to be processed in combination with corresponding symbols and as such are assumed to be implemented in a circuit.

For instance, in the 4-element example over GF(8) as provided above or in the case of the 4-element binary example 4 n-state symbols (with n being 2 or greater) are required to determine the new content of the shift register at a synchronization moment. The states are determined by 4 n-state expressions that each has at maximum 4 terms. If it is fixed that only one synchronization moment is required then only these expressions have to be implemented and not the whole table. One may want to implement larger parts or even the whole table if one wants to determine based on other events when the synchronization has to take place.

In yet a further embodiment, the whole table can be generated by a procedure that applies substitution as explained above. A program can also be instructed to select the appropriate moment of synchronization and its related expressions. For instance, at a start of a communication, a receiver receives data that may include one or more of the following: data that determines a structure of an n-state LFSR, for instance a set of coefficients that determines the states, data related to a starting content, data related to a position of a symbol that is generated by a sequence generator at a transmitting side in a transmitted sequence of symbols, a time delay or a time in a frame that determines a moment of synchronization of the sequence generator at the receiving side. The receiver may also receive data that determines an expression to calculate the content of a corresponding LFSR at the moment of synchronization. A processor may also be programmed to calculate the relevant LFSR states based on received information, for instance to generate all or part of the tables as provided herein. This means that a receiver may operate in different or changing environments that apply different sequences.

It was already noted that one may store a sequence in a memory. Such a memory in one embodiment of the present invention is an addressable memory wherein a symbol in the sequence has an address that is related to a corresponding state of the related LFSR. Accordingly, as one aspect of the present invention, a content of the related LFSR for a synchronization moment is determined. This content is then related to an address in the addressable memory, for instance by adding an offset address that determines the actual address in the memory. At the moment of synchronization, the processor starts using symbols generated from the addressable memory, starting with the newly determined address at the synchronization moment. In general, addresses will be consecutive for consecutive symbols. However, this is not required and a translation table can be created in case of non-consecutive addresses to generate the correct consecutive symbols.

It is believed that the apparatus and methods provided herein offer very fast synchronization of a receiving apparatus with a sequence or symbols thereof being received by the receiving apparatus.

The n-state functions such as the adder and the multipliers over GF(n) can be implemented in different ways. In a first embodiment, a truth table of an n-state function is stored in an addressable memory. An input to such a memory is a signal representing an n-state symbol. An output of such a memory is a state of the truth table dependent on the input. Signals may be binary signals or non-binary signals. N-state truth tables may also be implemented by active switching circuits. For instance, adders and multipliers over $GF(n^m)$ with m>1 can be implemented with binary circuits, which is known in the art.

The encoding, reverse encoding, error location and error correction aspects that are provided herein can be applied in different kind of systems wherein symbols are transmitted and/or received and/or processed as signals. Many of these systems require processing of symbols at a speed that requires processors working at a clock rate of at least 1 kHz or at least 1 Mhz. This means that humans cannot reasonably perform the steps provided herein as one or more aspects of the present invention and processing circuitry, which can be electronic or other type of processing circuitry, is required. An n-state symbol with n>2 can in one embodiment be represented by a plurality of signals, for instance binary signals. An n-state symbol in another embodiment can also be represented as an n-state signal. A processor thus herein is assumed to be comprised of binary or n-state switching circuitry to implement at least one binary or n-state switching function.

Figure 11:
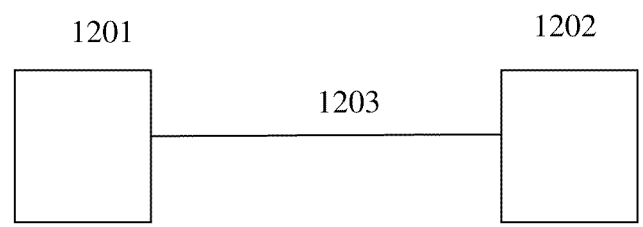
FIGS. 11 and 12 illustrate a system in accordance with an aspect of the present invention
Figure 12:
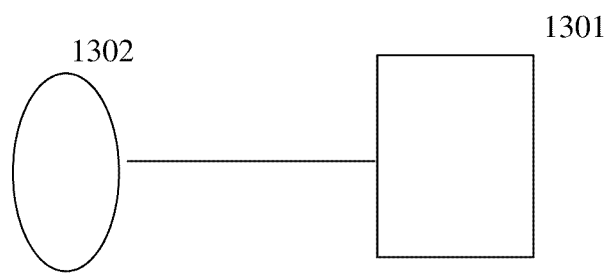

A system that applies aspects of the invention as provided herein is a communication system as shown in FIG. 11, including at least two devices that communicate of which a first device 1201 transmits n-state symbols which can be binary symbols or symbols with n>2 over a channel 1203 and a second device 1202 receives and synchronizes with n-state symbols transmitted by the first device. Devices in such a communication system in one embodiment transmit over a wireless channel 1203. In a further embodiment, the devices transmit at least over part of a transmission channel over a wired transmission channel 1203, which may be an optical fiber medium or a metallic medium. A system in another embodiment is a data storage system as shown in FIG. 12 wherein a device 1301 reads n-state symbols from a medium 1302. Such a medium in one embodiment is an electronic memory. In a further embodiment a storage medium 1302 is a magnetic medium. In yet a further embodiment, a storage medium is an optical, an electro-optical, or a magneto-optical medium. In yet a further embodiment, a storage medium is a medium that can store n-state symbols and is enabled to be read by a reader to read the n-state symbols from the medium.

The synchronization steps and apparatus may also be applied to synchronize parts inside a computing device. Thus, the synchronizations methods and apparatus can also be part of a computing device.

An n-state symbol can be represented by a plurality of binary symbols or by a single n-state symbol or is a binary symbol. A symbol on a medium is in one embodiment a modification of the medium at a certain location which can be called a mark. A mark can be a change in an electronic, magnetic, optical, chemical, quantum-mechanical, biological, or mechanical property or a combination thereof. A mark can also be represented by a logical state of a device, which may be reflected in a dynamical switching property such as exhibited by a memory latch. A mark can also be represented by a physical state of a material.

The n-state k-stage synchronized sequence generators in one embodiment generate an m-sequence. In another embodiment, the n-state k-state sequence generator generates a sequence which is shorter than an m-sequence. A sequence of $n^k-1$ symbols generated by such a generator may contain 2 or more distinguishable sequences. One can still synchronize such sequences with the methods and apparatus as provided herein. Such synchronization is fully contemplated and should be apparent to one of ordinary skill.

Generating states, as well as to be generated symbols are expressed as single n-state expressions which can be executed by a processor or a circuit. The expressions are specifically not expressed as a matrix or as a multiplication or a power of matrices, as these require additional processing and slow down the synchronization process. In a matrix process a variable may be applied more than once in an expression and again requires intermediate steps that slow down the evaluation process, which is circumvented in the present approach.

An expression herein that determines a shift register element state or a symbol is an expression that contains only a single term that depends on a specific variable, which is a received n-state symbol. As is well known, a matrix may contain 2 or more terms that depend on a specific variable.

In one embodiment the expressions are represented and stored in memory as coefficients of an expression. Symbol values are the variables of such expressions. Coefficients and variables correspond to positions of symbols in a memory. For instance a k variable expression can be saved as n-state memory [c1 c2 c3 c4] corresponding to n-state symbols [x1 x2 x3 x4] representing the linear n-state expression c1*x1+ c2*x2+c3*x3+c4*x4, wherein k=4 in this example. Linear expression herein means wherein a symbol is used as a variable to the power 1 only. The function + is a reversible n-state function having at least 2 inputs and 1 output. The function * is a reversible n-state inverter applied to its corresponding symbol. In one embodiment + is an addition over GF(n) and * is a multiplier over GF(n).

Consecutively generated symbols herein means symbols directly following each other without any intervening symbols. For instance, if symbols are generated only on moments 1, 2, 3, 4 and 5 for instance and the 5 generated symbols are a, b, c, d and e generated on moments 1, 2, 3, 4 and 5 respectively then [a b c d e] are consecutive symbols. Symbols a and c, for instance, are not considered consecutive symbols herein.

Figure 13:
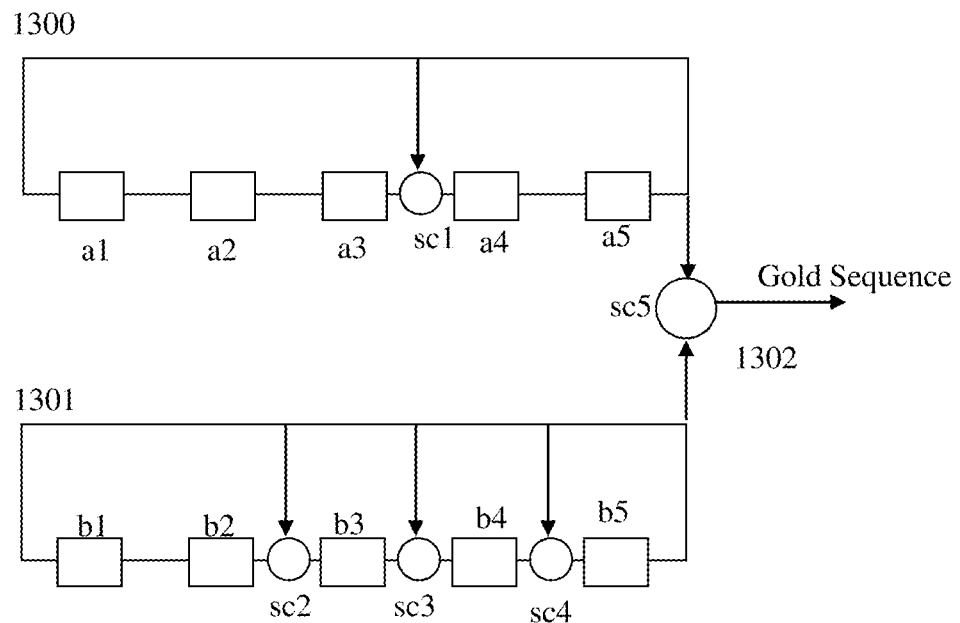
FIG. 13 is a diagram of a binary Gold sequence generator.

Synchronization of Binary and Non-Binary Combination or Composition Sequences and their Generators The above dealt with sequences related to at least a single LFSR. It is known that binary and non-binary sequences can be generated by at least two sequence generators and combined through an n-state logic device. Examples of those sequences are binary and non-binary Gold sequences and Kasami sequences. These sequences are for instance used for their cross correlation properties. It is assumed that Kasami codes and their generators are known to one of ordinary skill Background on Kasami codes can for instance be found in U.S. Patent Appl. Pub. Ser. No. 20090250576 to Fullerton et al. published on Oct. 8, 2009, which is incorporated herein by reference. FIG. 13 provides a diagram of a Gold sequence, consisting of an LFSR 1300 and 1301 of which the outputs are connected through an n-state switching function 1302. The LFSR 1300 has 5 shift register elements with a content [a1 a2 a3 a4 a5] and an n-state switching function sc1, wherein n=2 or n>2 (such as n=8). The LFSR 1301 has 5 shift register elements with a content [b1 b2 b3 b4 b5] and an n-state switching functions sc2, sc3 and sc4, wherein n=2 or n>2 (such as n=8). The outputs of 1300 and 1301 of n-state symbols are inputted on a device or an implementation determined by n-state switching function sc5, which provides on an output an n-state Gold sequence.

In the binary case sc1, sc2, sc3, sc4 and sc5 are all for example XOR functions, though any of these functions may also be an '=' function. An LFSR may be characterized by its taps and the n-state inverters or n-valued multipliers in these taps. The input into the first shift register element and the output from the last shift register element are also considered taps. A tap in the binary case is a '1' or a connection and a '0' is lack of connection. LFSR 1300 can be represented as [1 0 0 1 0 1] and 1301 as [1 0 1 1 1 1].

Figure 14:
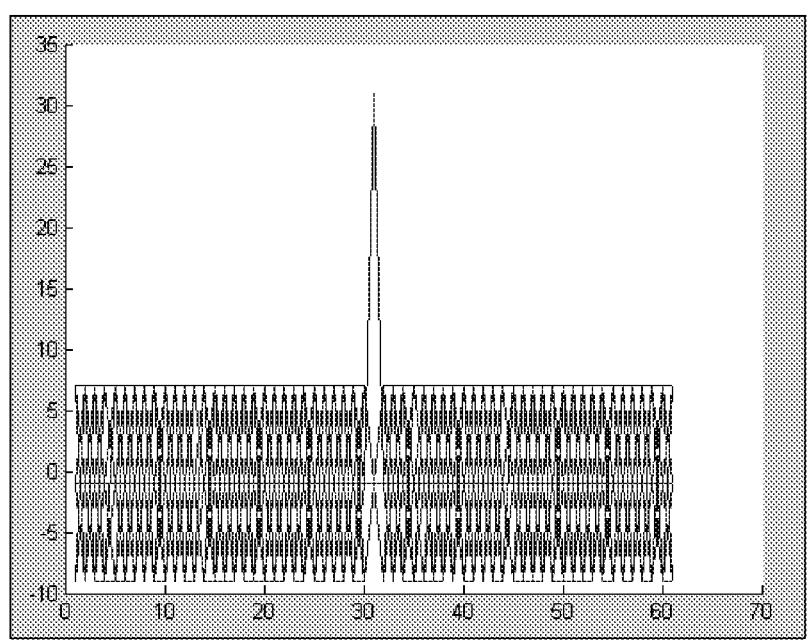
FIG. 14 is a correlation graph.

The Gold sequence has a non-repeating length of 31 symbols. An overlay of an auto-correlation graph of a binary Gold sequence and about 20 other binary Gold sequence generated by the generator of FIG. 13 is shown in FIG. 14.

Each of the LFSRs has its own table that determines its LFSR states as was shown before above. The state table for LFSR 1300 is shown below.

| cycle 1300 | | SR1 | | | | | SR2 | | | | | SR3 | | | | | SR4 | | | | | SR5 | | | |
|---|---|---|---|---|---|---|---|---|---|---|---|---|---|---|---|---|---|---|---|---|---|---|---|---|---|
| 0 | 1 | 0 | 0 | 0 | 0 | 0 | 1 | 0 | 0 | 0 | 0 | 0 | 1 | 0 | 0 | 0 | 0 | 0 | 1 | 0 | 0 | 0 | 0 | 0 | 1 |
| 1 | 0 | 0 | 0 | 0 | 1 | 1 | 0 | 0 | 0 | 0 | 0 | 1 | 0 | 0 | 0 | 0 | 0 | 1 | 0 | 1 | 0 | 0 | 0 | 1 | 0 |
| 2 | 0 | 0 | 0 | 1 | 0 | 0 | 0 | 0 | 0 | 1 | 1 | 0 | 0 | 0 | 0 | 0 | 1 | 0 | 1 | 0 | 0 | 0 | 1 | 0 | 1 |
| 3 | 0 | 0 | 1 | 0 | 1 | 0 | 0 | 0 | 1 | 0 | 0 | 0 | 0 | 1 | 1 | 0 | 1 | 0 | 1 | 0 | 1 | 0 | 1 | 0 |
| 4 | 0 | 1 | 0 | 1 | 0 | 0 | 0 | 1 | 0 | 1 | 0 | 0 | 1 | 0 | 0 | 1 | 0 | 1 | 1 | 1 | 0 | 1 | 0 | 1 |
| 5 | 1 | 0 | 1 | 0 | 1 | 0 | 1 | 0 | 1 | 0 | 0 | 1 | 0 | 1 | 1 | 0 | 1 | 1 | 1 | 0 | 1 | 0 | 1 | 1 |
| 6 | 0 | 1 | 0 | 1 | 1 | 1 | 0 | 1 | 0 | 1 | 0 | 1 | 0 | 0 | 1 | 1 | 1 | 0 | 1 | 0 | 1 | 1 | 1 |
| 7 | 1 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 |
| 8 | 0 | 1 | 1 | 1 | 0 | 1 | 0 | 1 | 1 | 1 | 0 | 1 | 0 | 1 | 1 | 1 | 0 | 1 | 1 | 1 | 1 | 1 | 0 | 1 |
| 9 | 1 | 1 | 1 | 0 | 1 | 0 | 1 | 1 | 1 | 0 | 1 | 0 | 1 | 1 | 1 | 0 | 1 | 1 | 0 | 1 | 1 | 0 | 1 | 1 |
| 10 | 1 | 1 | 0 | 1 | 1 | 1 | 1 | 1 | 0 | 1 | 0 | 1 | 1 | 0 | 0 | 1 | 1 | 0 | 1 | 0 | 1 | 0 | 1 | 1 | 0 |

In the above table [1 0 0 0 0]=[a1 0 0 0 0]; [0 1 0 0 0]=[0 a2 0 0 0]; etc.

The state table for LFSR 1301 is shown below.

| cycle 1301 | | SR1 | | | | | SR2 | | | | | SR3 | | | | | SR4 | | | | | SR5 | | | |
|---|---|---|---|---|---|---|---|---|---|---|---|---|---|---|---|---|---|---|---|---|---|---|---|---|---|
| 0 | 1 | 0 | 0 | 0 | 0 | 0 | 1 | 0 | 0 | 0 | 0 | 0 | 1 | 0 | 0 | 0 | 0 | 0 | 1 | 0 | 0 | 0 | 0 | 0 | 1 |
| 1 | 0 | 0 | 0 | 0 | 1 | 1 | 0 | 0 | 0 | 0 | 0 | 1 | 0 | 0 | 1 | 0 | 0 | 1 | 0 | 1 | 0 | 0 | 0 | 1 | 1 |

| cycle 1301 | SR1 | | | | SR2 | | | | SR3 | | | | SR4 | | | | SR5 | | | |
|---|---|---|---|---|---|---|---|---|---|---|---|---|---|---|---|---|---|---|---|---|
| 2  | 0 | 0 | 0 | 1 | 1 | 0 | 0 | 0 | 0 | 1 | 1 | 0 | 0 | 1 | 1 | 0 | 1 | 0 | 1 | 0 | 0 | 0 | 1 | 1 | 0 |
| 3  | 0 | 0 | 1 | 1 | 0 | 0 | 0 | 0 | 1 | 1 | 0 | 0 | 1 | 1 | 1 | 1 | 0 | 1 | 0 | 1 | 0 | 1 | 1 | 0 | 0 |
| 4  | 0 | 1 | 1 | 0 | 0 | 0 | 0 | 1 | 1 | 0 | 0 | 1 | 1 | 1 | 1 | 0 | 1 | 0 | 1 | 1 | 1 | 1 | 0 | 0 | 1 |
| 5  | 1 | 1 | 0 | 0 | 1 | 0 | 1 | 1 | 0 | 0 | 1 | 1 | 1 | 1 | 1 | 0 | 1 | 1 | 0 | 1 | 0 | 0 | 1 | 0 |   |
| 6  | 1 | 0 | 0 | 1 | 0 | 1 | 1 | 0 | 0 | 1 | 1 | 1 | 1 | 0 | 0 | 1 | 1 | 0 | 1 | 0 | 0 | 1 | 0 | 0 |   |
| 7  | 0 | 0 | 1 | 0 | 0 | 1 | 0 | 0 | 1 | 0 | 1 | 1 | 1 | 0 | 1 | 1 | 1 | 0 | 0 | 1 | 0 | 0 | 0 | 1 |   |
| 8  | 0 | 1 | 0 | 0 | 1 | 0 | 0 | 1 | 0 | 0 | 1 | 1 | 0 | 1 | 1 | 1 | 0 | 1 | 0 | 0 | 1 | 0 | 0 | 1 | 1 |
| 9  | 1 | 0 | 0 | 1 | 1 | 0 | 1 | 0 | 0 | 1 | 1 | 0 | 1 | 1 | 1 | 0 | 1 | 0 | 0 | 0 | 0 | 0 | 1 | 1 | 1 |
| 10 | 0 | 0 | 1 | 1 | 1 | 1 | 0 | 0 | 1 | 1 | 0 | 1 | 1 | 1 | 0 | 1 | 0 | 0 | 0 | 0 | 0 | 1 | 1 | 1 | 1 |

In the above table [1 0 0 0 0]=[b1 0 0 0 0]; [0 1 0 0 0]=[0 b2 0 0 0]; etc.

As before, one can translate back the states of the LFSRs to outputted symbols [u v w x y].

Accordingly, each symbol in the Gold Sequence is related to 2 symbols, outputted by 1300 and 1301, respectively. This clearly means that determining a synchronization state for the Gold Sequence requires two times 5 symbols. This allows the determination of n LFSR state of 1300 and 1301 at a moment k, determined by for instance the last of 10 synchronization symbols received by a receiver with synchronization capabilities. The synchronization symbols may be provided in pairs, each pair providing symbols n1 and n2 generated at the same time by 1300 and 1301, respectively. However, symbols may also be generated at different times, as long as the receiver is able to determine when a synchronization symbol is received and to which LFSR it belongs. A pair (n1 n2) has some advantages herein, as one may always assign n1 to 1300 and n2 to 1301. But other arrangements are possible and have been fully contemplated and work as well in creating a synchronization point.

A listing of Matlab script to determine the above table is shown in FIG. 15. All arrays and array or matrix operations are in origin 1 and the binary states are represented as 1 and 2.

There are several ways to determine the next synchronization state of the LFSR. In a first embodiment one can provide an expression that expresses the individual states of the synchronization point as a function of received (sample) symbols.

In another embodiment, one can store an LFSR state table as provided above and in a first step calculate the initial state of the LFSR based on the received symbols and then calculate the actual individual states of the LFSR at the desired synchronization moment. This means that one has to know what the relative position of the sample symbols is, relative to a first symbol. This can be known, for instance because of the way that sampling is implemented. Or a received sample symbol is provided with data that for instance provides its distance to a previous sample symbol.

The initial states can then be calculated for instance by applying Cramer's rule wherein (in the 5-element shift register case) initial states [a1 a2 a3 a4 a5] in [a1 0 0 0 0]; [0 a2 0 0 0]; [0 0 a3 0 0]; [0 0 0 a4 0]; and [0 0 0 0 a5] are unknowns and received symbols [u v w x y] on moments 1, 1+t1, 1+t2, 1+t3, and 1+t4 are known.

Illustrative Matlab script for solving initial states in provided in FIGS. 16-18. FIG. 16 illustrates an implementation of solving a determinant as part of Cramer's rule, using the appropriate binary functions. FIG. 17 illustrates an implementation in Matlab to determine initials state after 5 consecutive symbols have been received. It is assumed that the received symbols are [2 1 2 2 2] (or [1 0 1 1 1] in origin 1). The following table shows the output states of the LFSR that determine the output.

| moment | | | | | |
|---|---|---|---|---|---|
| 1 | 1 | 1 | 1 | 1 | 2 |
| 2 | 1 | 1 | 1 | 2 | 1 |
| 3 | 1 | 1 | 2 | 1 | 2 |
| 4 | 1 | 2 | 1 | 2 | 1 |
| 5 | 2 | 1 | 2 | 1 | 2 |

The binary value of the above determinant is 1. The state a1 is determined by evaluating the above determinant wherein the first column is replaced by [2 1 2 2 2] etc, in accordance with Cramer's rule. The result is [a1 a2 a3 a4 a5]=[1 2 1 1 2]. One can check that this is correct by evaluating the rows of the above table. One can then evaluate the synchronization state on the desired moment by evaluating the relevant row of the earlier provided table.

FIG. 18 illustrates the procedure for symbols [2 1 2 2 2] received at moments 1, 4, 7, 10 and 13. The relevant output states are provided in the following table:

| moment | | | | | |
|---|---|---|---|---|---|
| 1  | 1 | 1 | 1 | 1 | 2 |
| 4  | 1 | 2 | 1 | 2 | 1 |
| 7  | 2 | 1 | 2 | 2 | 2 |
| 10 | 2 | 2 | 1 | 2 | 2 |
| 13 | 2 | 2 | 1 | 1 | 1 |

The required initial states are then [1 2 2 2 2]. Based on that one can determine the states on the synchronization moment.

The above process can be repeated for the second LFSR when one is synchronizing a combination sequence such as a Gold sequence.

Figure 19:
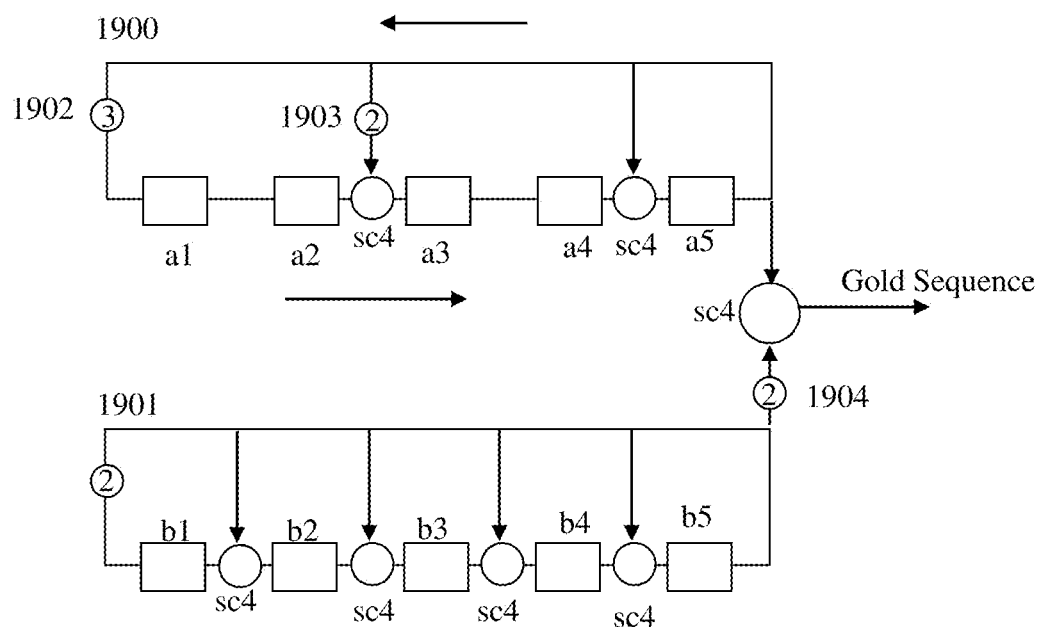
FIG. 19 is a diagram of a non-binary Gold sequence generator.

FIG. 19 is a diagram that illustrates a non-binary combination sequence generator, which in this illustrative example is a 4-state Gold sequence generator. The inventor has shown in U.S. Pat. No. 7,580,472 issued on Aug. 25, 2009 to Lablans, and which is incorporated herein by reference, how to create non-binary sequences such as Gold sequences. FIG. 19 shows a first 4-state 5-element sequence generator 1900, determined by multipliers [3 0 2 0 1 1] and additions sc4 all over GF(4) and a second sequence generator 1901 determined by multipliers [2 1 1 1 1 1] and addition sc4 all over GF(4). The output of 1901 is inverter by a 4-state inverter 1904, which is a multiplier 2 over GF(4) which is then added by an addition sc4 over GF(4) with the output of 1900 to generate a Gold sequence. Required clock signals should be assumed, though not specifically drawn, to avoid obscuring other details.

Figure 20:
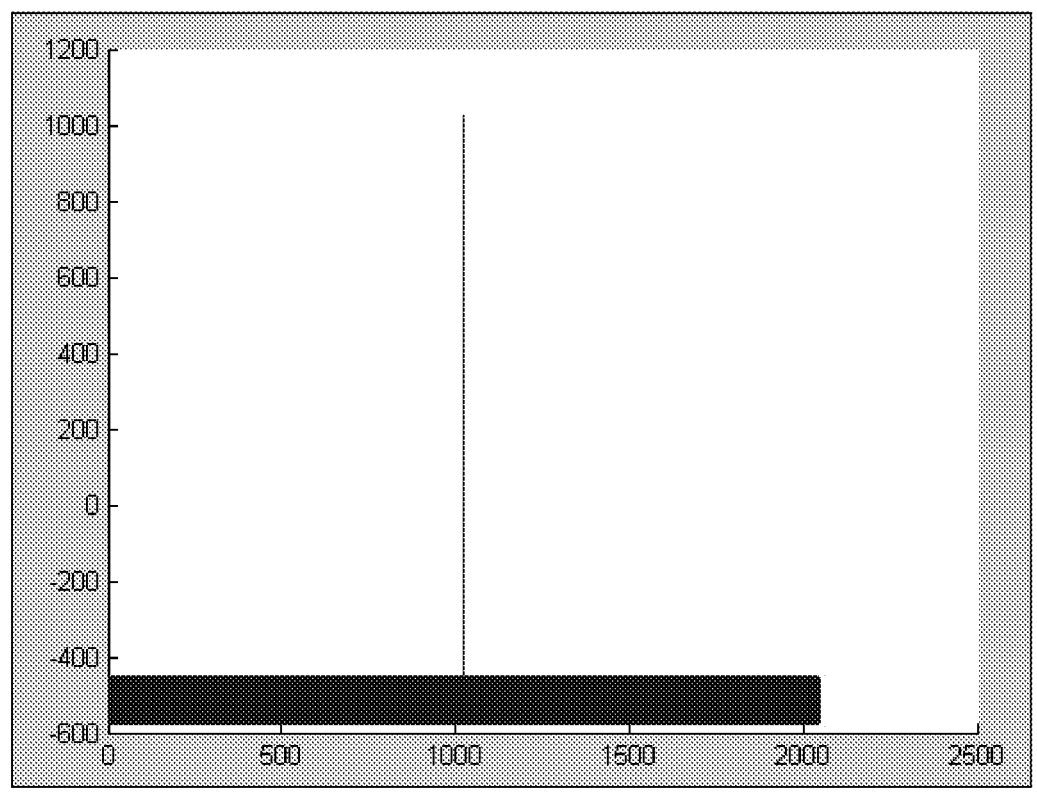
FIG. 20 is another correlation graph.

FIG. 20 shows a correlation graph of 19 different cross-correlated sequences generated by the generator of FIG. 19 and an overlay of one auto-correlation graph of a sequence generated by the generator. All generated sequences by 1900 and 1901 are maximum-length sequences, as determined by an auto-correlation graph that is flat, except for one high peak that indicates alignment. Correlation is determined by comparing two symbols and only adding a term to a correlation sum when symbols are identical. By using a term that is independent of the state of the symbols, as explained by the inventor in for instance the above cited U.S. Pat. No. 7,580,472, one obtains a clear indication of maximum length. The 'known' correlation method which uses a multiplication of symbol values in general creates a correlation graph with side lobes, which may be more difficult to interpret if one is searching for attractive n-state sequences. However, the use of known correlation techniques may be preferred to detect an n-state sequence among a plurality of m-state sequences.

The inverter 1904 herein is used for illustrative purposes, to demonstrate that one may use different ways to combine n-state sequences. The function sc4, which is an addition over GF(4) and multiplier 2 over GF(4) which may be represented by inverter [0 1 2 3]→[0 2 3 1] can be replaced by a single non-commutative truth table which may be implemented as a single look-up table in a memory. The same applies to any other n-state n by n truth table with at least one inverter at an input. For instance a set of truth tables which may further include n-state inverters may be stored in a memory. They may be provided with an identifying code which is known both to the receiver and the transmitter. By transmitting such a code which is associated with a synchronization time, for instance by providing an external instruction thereto, a receiver will implement the relevant function and/or inverter at the appropriate moment.

FIG. 21 shows a listing of Matlab script to determine a table of LFSR states for the sequence generator 1900. The following table provides the first 10 LFSR states.

| cycle 1900 | | | | | | SR1 | | | | | | SR2 | | | | | SR3 | | | | | SR4 | | | | | SR5 |
|---|---|---|---|---|---|---|---|---|---|---|---|---|---|---|---|---|---|---|---|---|---|---|---|---|---|---|---|
| 0 | 1 | 0 | 0 | 0 | 0 | 0 | 1 | 0 | 0 | 0 | 0 | 0 | 1 | 0 | 0 | 0 | 0 | 1 | 0 | 0 | 0 | 0 | 0 | 1 |
| 1 | 0 | 0 | 0 | 0 | 3 | 1 | 0 | 0 | 0 | 0 | 0 | 1 | 0 | 0 | 2 | 0 | 0 | 1 | 0 | 0 | 0 | 0 | 1 | 1 |
| 2 | 0 | 0 | 0 | 3 | 3 | 0 | 0 | 0 | 0 | 3 | 1 | 0 | 0 | 2 | 2 | 0 | 1 | 0 | 0 | 2 | 0 | 0 | 1 | 1 | 1 |
| 3 | 0 | 0 | 3 | 3 | 3 | 0 | 0 | 0 | 3 | 3 | 0 | 0 | 2 | 2 | 1 | 1 | 0 | 0 | 2 | 2 | 0 | 1 | 1 | 1 | 3 |
| 4 | 0 | 3 | 3 | 3 | 2 | 0 | 0 | 3 | 3 | 3 | 0 | 2 | 2 | 1 | 2 | 0 | 0 | 2 | 2 | 1 | 1 | 1 | 1 | 3 | 1 |
| 5 | 3 | 3 | 3 | 2 | 3 | 0 | 3 | 3 | 3 | 2 | 2 | 2 | 1 | 2 | 1 | 0 | 2 | 2 | 1 | 2 | 1 | 1 | 3 | 1 | 0 |
| 6 | 3 | 3 | 2 | 3 | 0 | 3 | 3 | 3 | 2 | 3 | 2 | 1 | 2 | 1 | 2 | 2 | 1 | 2 | 1 | 1 | 3 | 1 | 0 | 2 |
| 7 | 3 | 2 | 3 | 0 | 1 | 3 | 3 | 2 | 3 | 0 | 1 | 2 | 1 | 2 | 0 | 2 | 1 | 2 | 1 | 2 | 3 | 1 | 0 | 2 | 3 |
| 8 | 2 | 3 | 0 | 1 | 2 | 3 | 2 | 3 | 0 | 1 | 2 | 1 | 2 | 0 | 1 | 1 | 2 | 1 | 2 | 0 | 1 | 0 | 2 | 3 | 1 |
| 9 | 3 | 0 | 1 | 2 | 3 | 2 | 3 | 0 | 1 | 2 | 2 | 0 | 1 | 3 | 0 | 2 | 1 | 2 | 0 | 1 | 0 | 2 | 3 | 1 | 1 |
| 10 | 0 | 1 | 2 | 3 | 4 | 3 | 0 | 1 | 2 | 3 | 0 | 1 | 3 | 0 | 3 | 1 | 2 | 0 | 1 | 3 | 2 | 3 | 1 | 1 | 0 |

The initial LFSR states can be determined again in accordance with Cramer's rule. For instance, assume that 5 consecutive 4-state symbols are received related to the first 5 states of the LFSR. These 5 symbols are [2 1 3 4 2] (or [1 0 2 3 1] in origin 0). The determining equations are provided by the first 5 output states (of SR5) which are provided in the following table.

| moment | | | | | |
|---|---|---|---|---|---|
| 1 | 1 | 1 | 1 | 1 | 2 |
| 2 | 1 | 1 | 1 | 2 | 2 |
| 3 | 1 | 1 | 2 | 2 | 2 |
| 4 | 1 | 2 | 2 | 2 | 4 |
| 5 | 2 | 2 | 2 | 4 | 2 |

The determinant can be evaluated by the procedure as illustrated by a Matlab listing in FIG. 22. The determinant of the above matrix is 1. Cramer's rule is then evaluated by replacing the relevant columns by $[2\ 1\ 3\ 4\ 2]^T$ and determining the determinant. This is illustrated by the Matlab script listing in FIG. 23. This will generate the initial states [2 3 2 1 1] (or [1 2 1 0 0] in origin 0). The initial state of the LFSR is then {[1 0 0 0 0]; [0 2 0 0 0]; [0 0 1 0 0]; [0 0 0 0 0] and [0 0 0 0 0]}. One can easily check these results by evaluating the expressions c1*a1+c2*a2+c3*a3+c4*a4+c5*a5 wherein [c1 c2 c3 c4 c5] are provided by the states of SR5 and [a1 a2 a3 a4 a5] is the just evaluated initial state vector. The operations '*' and '+' are the multiplication and addition over GF(4).

A similar approach can be used when the symbols do not represent consecutive states. Furthermore, the initial state and the state tables now allow determining the LFSR state on a synchronization moment.

The above in one embodiment of the present invention is applied to synchronize two or more LFSRs that are used or can be used for instance for generating an n-state Gold sequence.

Code Hopping

The above methods can be easily implemented and are extremely fast. As an aspect of the present invention the above described methods are part of a code hopping method. That is: a receiver is instructed to jump on a defined moment to initialize an LFSR state that is different from the state that would establish previous synchronization. For instance, the LFSR determines a synchronization state based on received symbols. However, rather than implementing the evaluated synchronization states the LFSR implements new and different LFSR states which coincides with the same states that are being implemented at the transmitting side.

For instance, a receiver receives a series of k symbols representing k consecutive LFSR states and prepares for synchronization on moment (k+1). However, instead of loading the appropriate states to continue the LFSR from state on moment k to moment k+1, the LFSR is instructed to load the LFSR states related to a moment p rather than (k+1). At the same time, the transmitter also changes to this new LFSR state, and accordingly, the transmitter and receiver are synchronized. Code hopping can be useful for several situations, of which one is that an external and potentially unauthorized receiver that is listening in to data transmission will lose synchronization with the transmitter. If 'state hopping' only happens once and the transmitter continues to send synchronization symbols with predetermined positions, the opportunity exists to re-synchronize again rapidly. However, a transmitter may 'hop' continuously, each time before completing two complete series of synchronization symbols. The receiver may be programmed with instructions that tell it when to synchronize. Synchronization may also take place after different number of symbols, for instance a first sync after k symbols, a second sync after k+p1 symbols, a third sync after k+p2 symbols and the like.

How the LFSR hops through states may be determined by a programmed rule. Such a rule may be determined by a sequence and in a manner as disclosed in U.S. Pat. No. 7,930,331 issued on Apr. 19, 2011, which is incorporated herein by reference. Such a rule can be implemented in different receivers and allow these receivers to have orthogonal codes relative to each other. It also allows a transmitter to assign a code (by assigning an LFSR synchronization state) to a receiver that connects to a network that is orthogonal to receivers that are already operating in the network.

For instance, a quality measure between a transmitter and receiver may determine that the selected code is not optimal based on interfering signals. The transmitter may determine a code that is assumed to provide better quality. In yet a further embodiment of the present invention, a transmitter may provide the receiver with instructions to initiate a completely different LFSR, either with the same number of shift register elements, but with different taps. The receiver may also be instructed to initialize and use an LFSR with a different number of shift register elements, and includes the synchronizing states. It was already shown that an LFSR, for instance LFSR 1300 or 1900 are determined by a vector of coefficients. A transmitter may provide a receiver with a vector of coefficients that defines a new LFSR. A device may hop through different LFSRs based on external instructions or by internally programmed instructions.

The synchronization steps are described for a receiver. In accordance with an aspect of the present invention these methods apply to the receiving side of a receiver. In general a receiver also has transmitting capabilities. In accordance with a further aspect of the present invention the methods as provided herein also apply to the transmitting side of a receiver. Furthermore, in accordance with an aspect of the present invention, the methods provided herein apply to a transmitting device on a transmitter in a network and to the receiving side of a transmitter in a network.

A distinction between a transmitter and a receiver in a network in accordance with an aspect of the present invention is that the transmitter may take care of a plurality of receivers and may have additional network management and code and synchronization capabilities. A receiver usually acts in a following mode, following instructions of the transmitter. However, on some occasions a receiver, based for instance on a quality measure, may determine a lack of quality and request a change of code properties or initializes these changes, which are followed by the transmitter in some cases.

Thus, as one or more aspects of the present invention a method is provided for binary code hopping for sequences of binary symbols, wherein a symbol is represented by a signal. In accordance with an aspect of the present invention a sequence is generated by a single sequence generator. As an aspect of the present invention a binary code hop is created by modifying a synchronization state of a generator. As an aspect of the present invention a binary code hop is created by changing taps in an LFSR. As an aspect of the present invention a binary code hop is created by changing the length or number of shift register elements of an equivalent LFSR. As an aspect of the present invention a binary code hop is related to a combination sequence such as a Gold sequence. As an aspect of the present invention a binary code hop is created by changing the generating states and/or the configuration and/or the length of the LFSR of one or more of the constituting LFSRs of the combined generators. As an aspect of the present invention a binary code hop is part of a series of code hops related to a plurality of devices in such a way that the hopping rules of each of the devices create orthogonal codes and/or at least different codes.

Furthermore, as one or more aspects of the present invention a method is provided for code hopping for sequences of non-binary symbols, wherein a non-binary symbol is represented by a single or a plurality of signals. In accordance with an aspect of the present invention a non-binary sequence is generated by a single sequence generator. As an aspect of the present invention a non-binary code hop is created by modifying a synchronization state of the sequence generator. As an aspect of the present invention a non-binary code hop is created by changing taps or by changing inverters or multipliers in an LFSR. As an aspect of the present invention a non-binary code hop is created by changing the length or number of shift register elements of an equivalent LFSR. As an aspect of the present invention a non-binary code hop is related to a combination sequence such as a non-binary Gold sequence. As an aspect of the present invention a non-binary code hop is created by changing the generating states and/or the configuration and/or the length of the LFSR of one or more of the constituting LFSRs of the combined generators. As an aspect of the present invention a non-binary code hop is part of a series of code hops related to a plurality of devices in such a way that the hopping rules of each of the devices create orthogonal codes and/or at least different non-binary codes.

One additional difference between binary and non-binary methods is in the combining of the constituting sequences. In the non-binary case such combining uses at least an implementation of at least an n by n n-sate switching function. The combining function may be defined over a finite field $GF(n)$. However, that is not required. In general the combining function has to be a reversible n-state function. In one embodiment a combination n-state sequence may be created by combining at least three sequences. Furthermore, each of the inputs of the n-state combining function may be provided with an n-state multiplier or an n-state inverter which is preferably reversible. A non-binary code hop in a non-binary combination function may thus include modifying or inserting or removing a multiplier or n-state inverter at an input or output of the combining function. A non-binary code hop may also exist of modifying the combining function, for instance from one reversible n-state function into another n-state reversible n-state function, wherein an n-state combining function may have a non-commutative truth table. A combination non-binary sequence may be a non-binary Gold sequence before and after a code hop.

Figure 24:
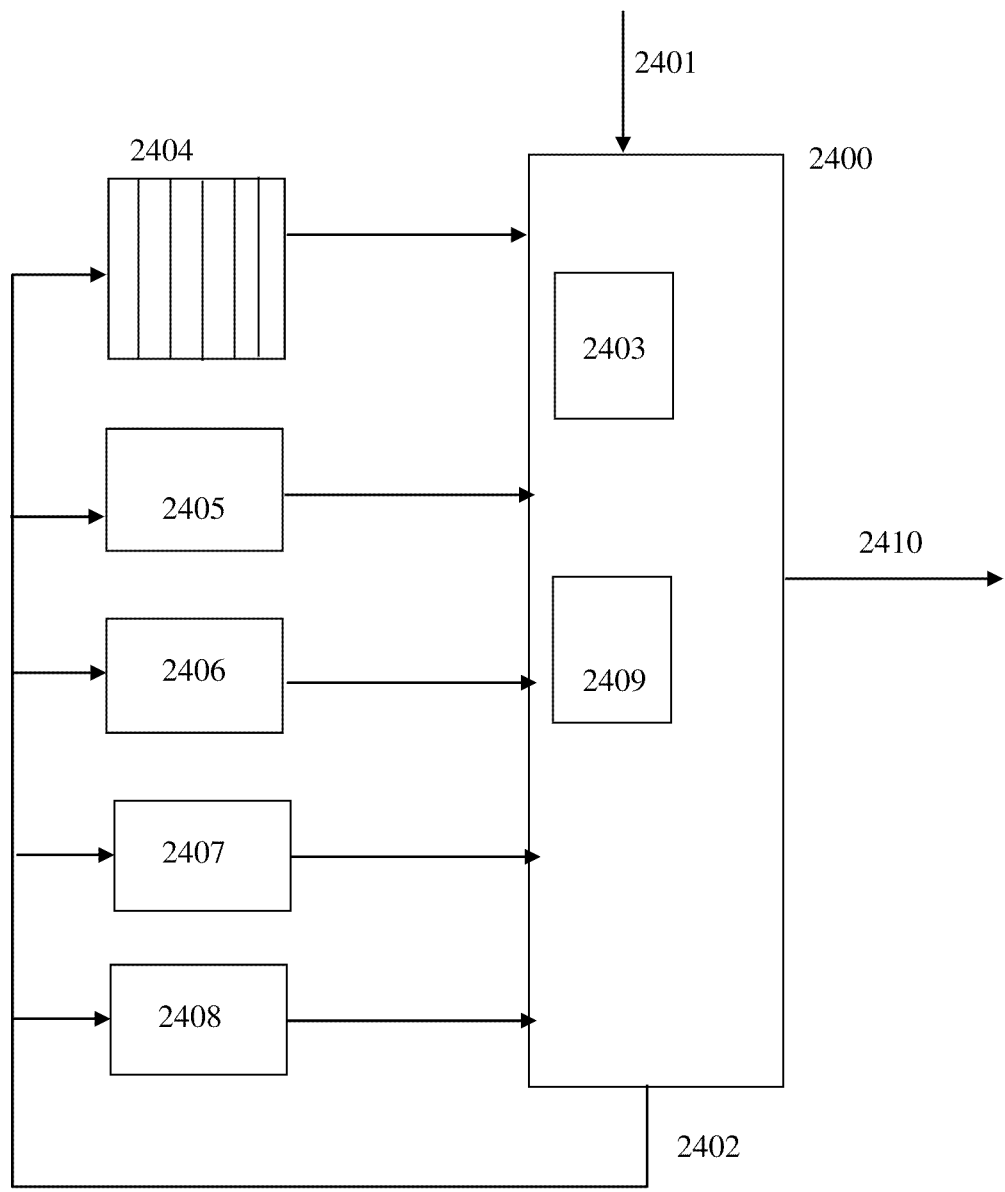
FIG. 24 is a diagram of a system in accordance with at least one aspect of the present invention.

FIG. 24 illustrates a code hopping device 2400 that is part of a communication device. The code hopping device has a processor 2403 that implements an LFSR related sequence generator, which may be a generator for binary or non-binary sequences. The sequence is provided on an output 2410 and can be used for purposes such as coding, decoding, scrambling, descrambling, opening a lock or any other useful purpose.

The processor sends, when required request for data, for instance to build or to synchronize a sequence generator to memories 2404, 2405, 2406 and 2407. There can be more memories or there can be fewer memories. The number of 4 memories or 4 partitions of memories is only provided as an illustrative example. For instance, memory 2404 in one embodiment of the present invention contains 1 or more tables related to an LFSR that provides for instance the coefficients of expressions that determine a synchronization position of an LFSR. System 2400 may receive on input 2401 data that reflects sample symbols for a synchronization moment. The processor 2403 provides an instruction on 2402 to 2404 to provide correct coefficients to calculate the synchronization states.

Data on 2401 may contain instructions for a modified synchronization or even to reconfigure the LFSR. For instance 2401 may contain data to hop code by creating new LFSR coefficients without changing the length of the LFSR. Processor 2403 may obtain these coefficients from memory 2405 and which will be received by 2403 to reconfigure the LFSR by providing instructions via 2402. An instruction for the correct synchronization state may be provided via 2402 simultaneously or near simultaneously to memory 2404.

Data on 2401 may contain instructions for a completely new LFSR, with a changed length and new coefficients. The design of such a new LFSR may be contained in 2407 and instructions to provide these LFSR data are provided through 2402. These data are in one embodiment provided to 2403 which will implement the new LFSR and may get required synchronization data from 2404.

Data on 2401 may contain data to change a design of a composition sequence such as a non-binary n-state Gold sequence. Relevant truth table for n-state functions to combine at least two n-state sequences are in one embodiment of the present invention stored in memory 2408 and at least one table is provided to processor 2403 after a request over 2402.

Much of the processing power in this example is performed by processor 2403. In a further embodiment of the present invention, processing functions of 2403 are distributed to other, parallel, processors, which are controlled by 2403.

In yet a further embodiment of the present invention, the code hopping for a session, such as during a connection with a counterpart device, is determined by a set of instructions stored in 2409, which sets forth how and when code hopping takes place. In that case 2409 replaces much of the instructions that were provided by 2401 and 2401 may provide at least only the sample symbols for synchronization. Instructions in 2409 may be pre-programmed and are known to a counterpart device to comply with data that is synchronous and understandable to 2400. In a further embodiment the instructions in 2409 are provided as part of an initialization or an update of a communication session or as part of device maintenance, for instance when it enters a cell in a cellular phone system.

In accordance with a further aspect of the present invention, code hopping includes a change in state of the LFSR. That is, the LFSR changes from an n-state operation into a p-state operation, wherein n and p are different integers greater than 1. For instance, an LFSR changes from binary mode into non-binary mode, or from non-binary mode into binary mode or from a first non-binary mode into a second non-binary mode. For instance, the LFSR changes from a binary LFSR into a 4-state LFSR. Or the LFSR changes from a 4-state mode into an 8-state mode, or from a 5-state mode into a 4-state mode, for instance. The LFSR in those cases applies shift register elements that can hold an n-state symbol and applies n-state switching or logic functions. A non-binary symbol may be represented by a plurality of binary symbols and signals.

In accordance with yet a further aspect, code hopping includes changing the clock rate with which a binary or non-binary LFSR generates symbols on an output. For instance a symbol rate changes from f1 n-state symbols per second to f2 n-state symbols per second, wherein f1 and f2 are different rates. For instance f1 is about 1000 symbols per second and f2 is about 1050 symbols per second, or f1 is about 1,000,000 symbols per second and f2 is about 500,000 symbols per second. Or f1 is about 1 billion symbols per second and f2 is about 2 billion symbols per second. Clearly, the processor works at a speed that cannot be even remotely approached by human capability.

A change in symbol rate may be combined with a change in state of the symbols, but such a combination is not required. It is noted that a change of symbol rate and a change of generating binary symbols in case of a binary circuit may be two separate occurrences. For instance one may code hop between a binary code and a 4-state code with the same symbol rate. However, if a 4-state symbol is represented by 2 bits and the output of the generator provides serial bit streams, then the bit rate will be at least doubled while the symbol rate stays the same.

In accordance with yet another aspect of the present invention, a code hop includes a hop between an n-state symbol and a p-state symbol with n and p being integers greater than 1 and p being different from n with an output providing a binary representation of the p-state and n-state symbol with an equal bit-rate on an output.

The code hopping and/or synchronization methods as provided herein as an aspect of the present invention, as they apply to binary or non-binary sequences are applied in different applications. An application, in accordance with an aspect of the present invention, is in a data storage system as part of writing or retrieving data. The storage system, in accordance with an aspect of the present invention, is a media player, which contains audio data and/or video data. An application, in accordance with an aspect of the present invention, is in a communication system, which may be in a receiver or a transmitter. The communication system, in accordance with an aspect of the present invention, is a wired communication system and the code hopping and/or synchronization is performed on or as part of a computer that is connected to a network, which may be the Internet. The communication system, in accordance with an aspect of the present invention, is a wireless communication system. In accordance with an aspect of the present invention, the code hopping and/or synchronization is performed on or as part of a mobile or a fixed computing device that is connected to a wireless network, which may be connected to the Internet. The device may be a PDA, a smart phone, a cellular phone, a tablet computer, an eReader, a router, or a media player. The device connected to a wireless network may also be a fixed computing device that for instance controls a cell or a set environment in a wireless network. For instance the device may be a router in a home or a building or a vehicle. The device in a wireless application may also be a portable or a fixed controller of a lock or a mechanism that is enabled to generate a binary sequence or a non-binary sequence that opens or closes the lock or the mechanism.

Herein, the terms value, state, n-valued, n-state, n-valued logic, n-state logic, and n-state switching are used. The terms value and state are assumed to be identical. The same applies to logic and switching. A logic is assumed to be identical to switching and a logic table is identical to a switching table.

Accordingly, it is possible and very easy to synchronize combination type sequences. One merely inputs received symbols in appropriate expressions, evaluates these expressions and re-initializes the relevant LFSRs at the relevant moment with these synchronization values. In an alternative embodiment, one can use the synchronization states of at least two LFSRs as a basis of an address for a stored symbol of a combination type of sequence and use this address to find the correct symbol at the synchronization moment.

In one embodiment of the present invention, a receiver receives symbols that allow it to synchronize with a transmitter. This appears to imply that all received symbols must have been already generated. The symbols may in one embodiment not be generated symbols, but a symbol that represents a state of an LFSR at a certain moment. If those moments are known to the receiver and it is known to the receiver what the moment of synchronization is, then a symbol may also be a future state of an LFSR or a future generated symbol by the LFSR. LFSR based generators are cyclic and thus a symbol in the past is a symbol in the future for an LFSR.

Figure 25:
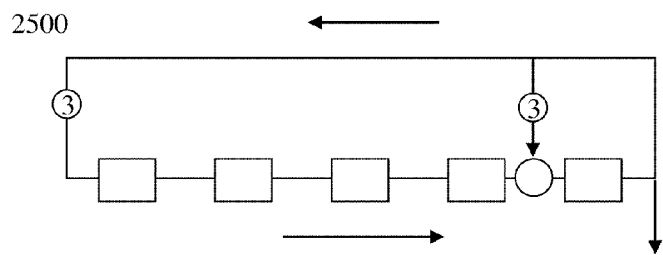
FIGS. 25-26 illustrate LFSRs in accordance with an aspect of the present invention.
Figure 26:
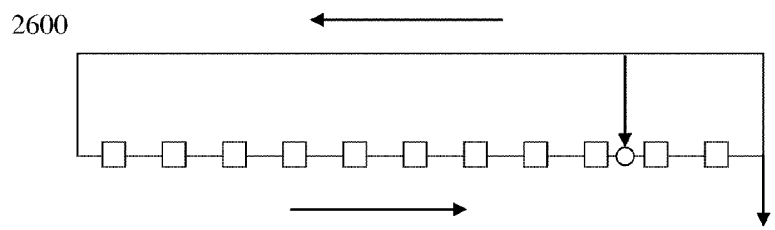

FIGS. 25 and 26 are diagrams that illustrate two different ways to generate different sequences. Sequence generator 2500 of FIG. 25 is a 4-state 5-stage sequence generator. It generates a 4-state m-sequence of length 1023 4-state symbols. By representing each 4-state symbol by 2 bits one generates a sequence of 2046 bits. FIG. 26 2600 shows a binary 11-stage sequence generator, which can generate a binary sequence of 2047 bits. One can reduce the sequence of 2600 to 2046 bits and correlate it with the equivalent binary sequence of 2500. One will find that the two sequences are uncorrelated. In accordance with an aspect of the present invention a code hop exits of a switch between sequence generators. Each sequence generated by an LFSR can be detected by an equivalent n-state LFSR based descrambler. This aspect is disclosed in U.S. Pat. No. 7,580,472 to Lablans issued on Aug. 25, 2009 which is incorporated herein by reference.

A simple way to detect the presence of the sequence generated by 2500 is to have the same sequence generator at the receiver and start at the same initial state. The locally generated sequence and a received sequence are then combined by a function scomp4 of which the truth table is provided below followed by an accumulator.

| scomp4 | 0 | 1 | 2 | 3 |
|---|---|---|---|---|
| 0 | 0 | 1 | 1 | 1 |
| 1 | 1 | 0 | 1 | 1 |
| 2 | 1 | 1 | 0 | 1 |
| 3 | 1 | 1 | 1 | 0 |

If both sequences are identical then the device implementing 'scomp4' will only generate 0s and the accumulated value is 0. If another sequence was received then the accumulated value will be greater than 1. One may also use the Fibonacci configuration of the sequence generator and a corresponding self-synchronizing descrambler.

Figure 27:
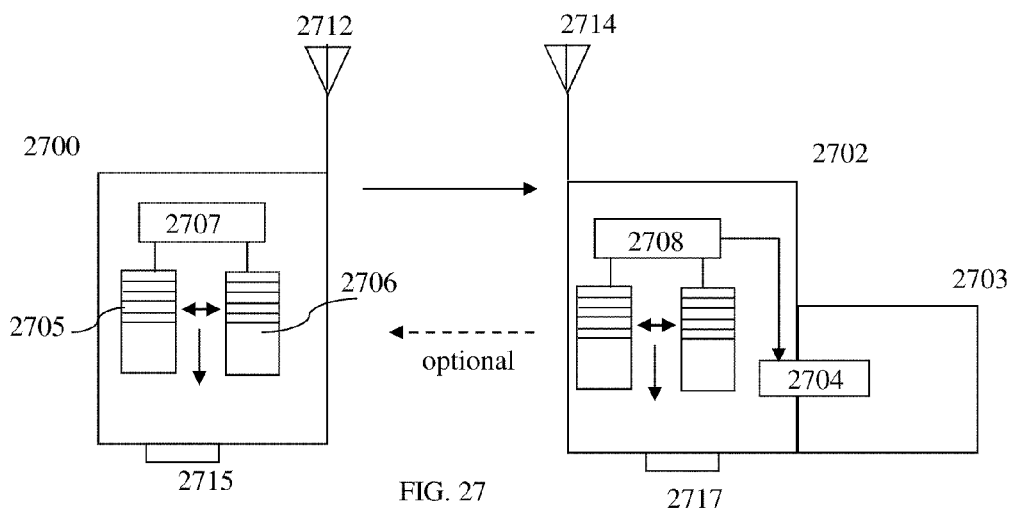
FIG. 27 is a diagram of a sequence generating system in accordance with an aspect of the present invention.

Rolling codes are known and are for instance applied in car locks. Such rolling codes are disclosed in for instance U.S. Pat. No. 7,623,663 to Farris et al. and issued on Nov. 24, 2009 which is incorporated herein by reference. The problem with some of the rolling codes is that the lock and/or the opening device have to remember a last locking code to open the lock with the new code. In accordance with an aspect of the present invention a lock is provided with a method by the opener to detect a code to open the lock. This illustrated in FIG. 27. A locking/unlocking system is applied to lock or unlock for instance a bolt or lock or a motor or other mechanism 2704 that is related to an object or structure 2703. For instance 2704 is a bolt in a door of a car 2703. The device 2704 may also be a relays in a starting-motor 2703. The bolt 2704 may also be part of a lock in a door 2703. The device 2704 may also be a motor in a garage door opener 2703.

The opening system contains a keying or opening/closing instruction transmitting device 2700, which is preferably a mobile and portable device and a receiver 2702. The transmitting device 2700 and the receiving device 2702 are able to communicate, preferably wirelessly. At least device 2700 is able to transmit, for instance via antenna 2712, to receiving device 2702, by receiving antenna 2714. In a further embodiment 2702 is enabled to transmit to 2700 and 2700 is enabled to receive and process the received signal.

The device 2700 has a coder 2707 which includes a transmitter and all functions to condition the signal for transmission. In a further embodiment of the present invention 2707 also is a receiver with sufficient receiving and detection capabilities. In one embodiment of the present invention the processor 2707 has access to memories 2705 and 2706. Memory 2705 contains the coefficients (taps, length of LFSR, state of LFSR and values of multipliers for n-state with n>2) of an LFSR based generator from which 2707 can implement in program the LFSR. Memory 2706 contains a code that determines the initial state of the LFSR. A configuration of an LFSR in 2705 has a specific address, and is directly associated with a corresponding address of the corresponding initial state in 2706. It is preferable to apply LFSRs with sufficient number of initial states. In one embodiment of the present invention one may have at least 1000 possible initial states per LFSR and at least 500 possible LFSR configurations. It is noted that the above examples use m-sequence generators. However, for at least the embodiment of FIG. 27 this is not required and thus over 500 different configurations for a 11-state binary LFSRs are possible. The same applies to the 5-stage 4-state LFSR. These numbers greatly increase for higher values of n. For instance, for an 8-state 5-stage LFSR there are over 25,000 different configurations and over 25,000 initial states. Larger numbers of shift register elements or a higher value logic such as an 256-state logic will dramatically increase the number of configurations. Even more configurations are possible if one interleaves or combines the symbols of two different or more sequence generators.

Figure 28:
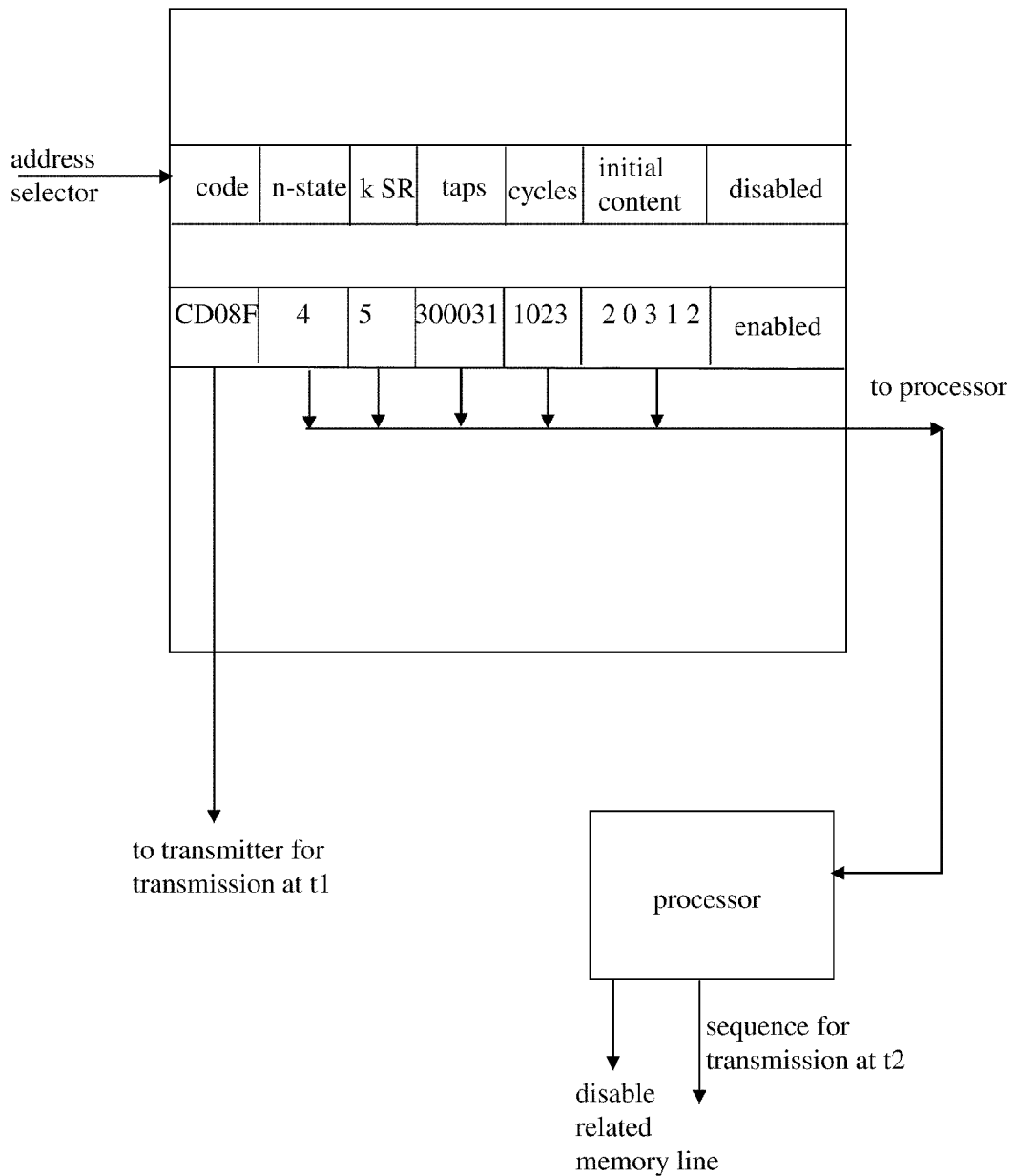
FIG. 28 is another diagram of a sequence generating system in accordance with an aspect of the present invention.

In one embodiment of the present invention different configurations are randomized in order and initial states are randomized. For instance assume that one has k1 generator configurations and k2 initial LFSR states. Assume that k3 different combinations of configurations and initial states are required. In one embodiment of the present invention one generates a first set of k1 different codes and a second set of k2 different codes and a set of k3 different codes. One orders the k1 configurations numbered from 1:k1 and the k2 initial states form 1:k2. Then one randomizes the k1 different codes and the k2 different codes. Next, each configuration is assigned to a first complying initial state, and is then assigned one of the randomized k3 codes. The table is stored in two memories, one in the transmitting device and one in the receiving device. This is illustrated in FIG. 28. In the opening or transmitting device an address selector selects a line in the memory. The address selector may step randomly through the memory to select a first enabled code. After using a code the code will be disabled or erased so it cannot be used anymore.

Randomization programs are well known. In one example one can generate a sequence of at least 100,000 5-bytes random numbers out of over 1 billion numbers, for instance by initializing a 5-element 256 state m-sequence LFSR with an initial state and generate 100,000 different 5-byte states by running the LFSR for 100,000 cycles. These 5-byte numbers are indexed as 1 through 100,000. One then takes a next at least 5-byte 256 state LFSR and generates that LFSR from a non-zero state for at least 100,000 cycles. In one example, the index 1 of the list of 5-byte random numbers is assigned the first 5-byte state of the second LFSR and so forth. This creates a list of 100,000 random 5-byte numbers. One can use several scrambling passes with different LFSRs to randomize. One can do the same with the configuration and initial states of the LFSR based sequence generators, and match a 5-byte number with a configuration and an initial state.

The randomized codes are stored in an order in a table, wherein a code is an address to a content which is the associated configuration and initial state. Accordingly, one can select a code in the table and find a corresponding LFSR configuration and initial state. As stated above, a code may also correspond to multiple LFSR configurations each with its own initial state. The data in these tables may include: number of shift register elements, the state n, the taps and the corresponding multipliers or inverters and the initial state, as well as the number of clock cycles that the LFSR will run, and possibly other properties. For instance, one line has a code [CD08F] which corresponds to a 4-state LFSR with 5 shift register elements and the configuration [300031] which is initialized with [2 0 3 1 2] and will be run to generate 1023 4-state symbols, for instance as 2046 binary symbols. This is of course an LFSR as shown in FIG. 25. The code will be provided to the transmitter to be sent at a time (or a time delay) t1. At time t2 (or time delay t2) the transmitter will transmit the sequence to the receiver.

The receiver has a similar construction, with a difference that the memory is code content addressable, for instance by using a translation table. The receiver will implement a decoder that will for instance only generate symbols 0 if the correct sequence is received and decoded.

Figure 29:
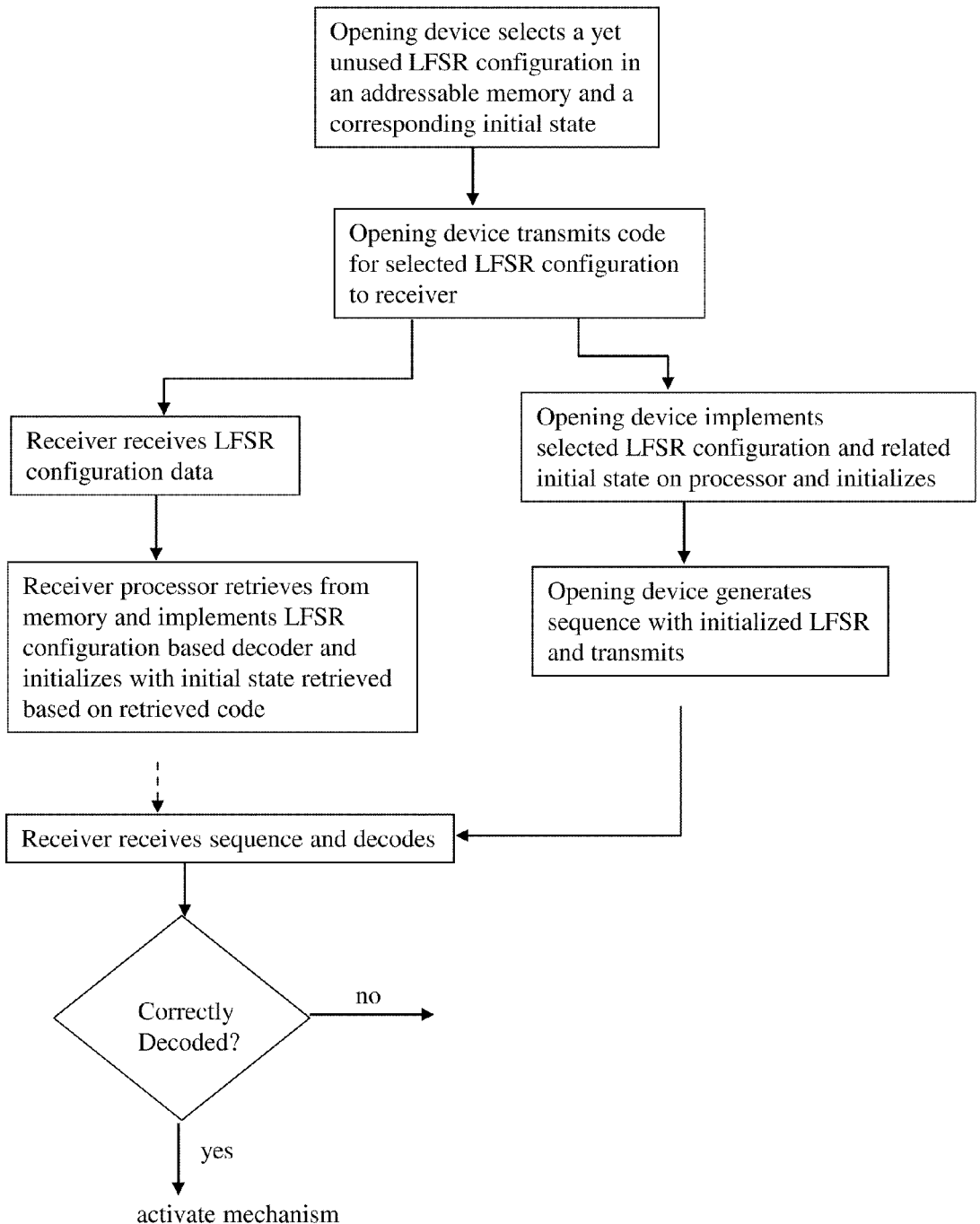
FIG. 29 illustrates steps in accordance with an aspect of the present invention.

The steps of coder and decoder are illustrated in FIG. 29. If the correct sequence is decoded, the decoder sends a signal to either a bolt, a relays or any other mechanism that will be activated. Thus a door, a structure or a lock can be opened or closed or some mechanism can be started or stopped. After receiving a code, the related configuration or memory address will be disabled. A malfeasant may for instance send a correct ID code but will generally be unable to follow up with the correct sequence. By disabling an ID code after it has been used once, one cannot try by brute force to crack a code.

A malfeasant may try to disable all codes by sending each ID of them to a receiver. One can address this issue by creating a code of at least 5 bytes. This selecting at random for instance 100,000 codes of at least 5 bytes it is impossible for a malfeasant to generate all possible codes in a reasonable time. If the receiver is set and required to wait at least for instance 0.5 sec, or least 1 second to process a new code, then a malfeasant has to generate all codes for about 10 million days to generate all possible ID codes. It is again emphasized that one may generate an ID code that is accepted by a receiver, but it is extremely unlikely that a correct follow-up sequence will be generated.

By using a sequence generator which generates long sequences, the chance to generate a correct sequence without having set-up information is extremely and infinitesimally small. One can generate very long sequences by using limited stored data. It is noted that one can also generate off-line different sequences, for instance of 5 bytes, which are then 40 bits long, which can be stored in memory and assigned a unique ID code. While these stored sequences are much smaller than the sequences that are generated in real time, they are still difficult to predict. For instance 100,000 different codes, each having a 5 bytes ID and a 5 bytes sequence, require 1 Meg bytes in storage, which is nowadays a fairly small part of the large memory that is currently available to mobile computing devices. Accordingly, storing an ID and a related sequence and exchanges ID codes and stored sequences with a receiving device is part of a method to open or close a lock or start or stop a mechanism provided in accordance with an aspect of the present invention.

In one embodiment of the present invention an ID code and the sequence are transmitted with an intermediate pause. One may also buffer the sequence at the receiving side, allowing to send the ID, virtually instantly followed by the sequence. In a further embodiment of the present invention a wake-up signal is received and processed by a processor, as an indication to a processor to prepare for either an ID code, or a sequence or any other signal that requires a preparation time for the processor.

Accordingly, a method and system is provided wherein a key instructs a lock on an opening method that is highly secure.

In a further embodiment of the present invention one can generate the coding table for the opener and the content addressable table for the receiver off-line on a computer and store the tables on for instance a USB memory device. The opener table can be uploaded to opener 2700 via a USB port 2715 and the content addressable table to the receiver via USB port 2717.

In a further embodiment of the present invention one can reverse some of the steps of the opening code. That is: in a first step an opener sends a request to a receiver for an opening sequence. In response, the processor 2708 selects a code and sends it to the opener. In that case 2700 has the content addressable memory. However, 2700 still will generate the sequence and 2702 will still receive and decode the sequence.

In a further embodiment the receiver 2700 is a portable and mobile and wireless computing device such as a cell phone, a smart phone, a tablet such as an IPAD®, a Personal Digital Assistant (PDA), an eReader, a laptop computer or a dedicated opener that is enabled to perform steps of the present invention.

A problem with a portable and mobile device is that it can easily be stolen. If important opening sequences, for instance for a car, a home or an office are stored on the device without protection, a malfeasant can easily open all doors using a stolen device. One can protect all code generating sequences by using some secret password. However, in many cases that defies the convenience of quickly opening a lock, for instance opening a garage door from a car.

In a further aspect of the present invention the opener has a sensor which is enabled to decode a pattern that is provided as a physical signal, such as a video signal, an acoustical signal or a pressure signal. The sensor thus is a camera, a microphone or a touch screen. The problem with acoustical and visible signals is that these signals can easily be stolen by a malfeasant. Thus, in accordance with an aspect of the present invention, an opener is provided with a touch-screen that can be programmed to learn a touch pattern provided by a user and detect the pattern with a high accuracy as a code to enable the generation of a start of the process that will open/close a lock or start/stop a mechanism.

Figure 30:
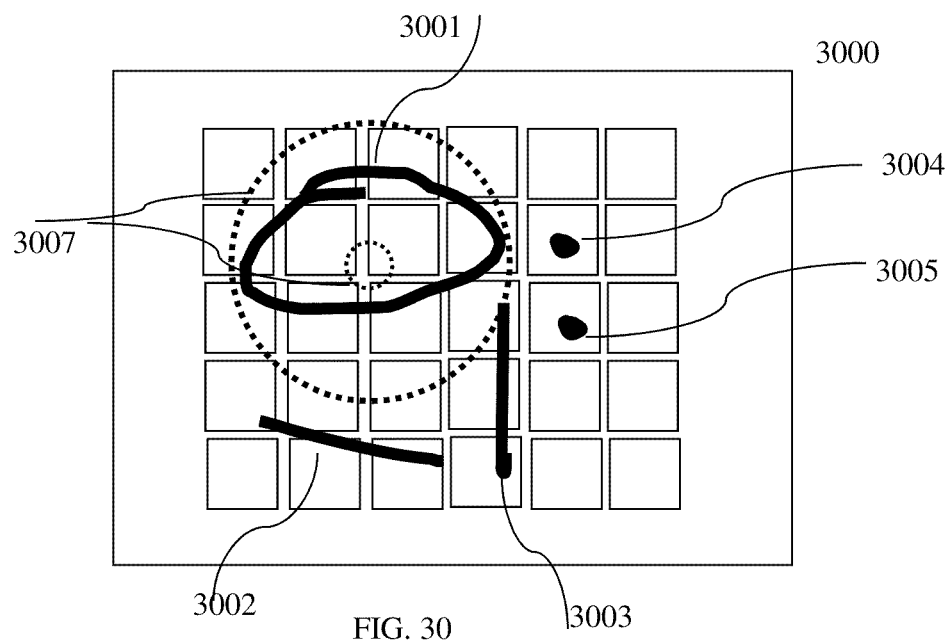
FIGS. 30-31 illustrate touch diagrams in accordance with an aspect of the present invention.
Figure 31:
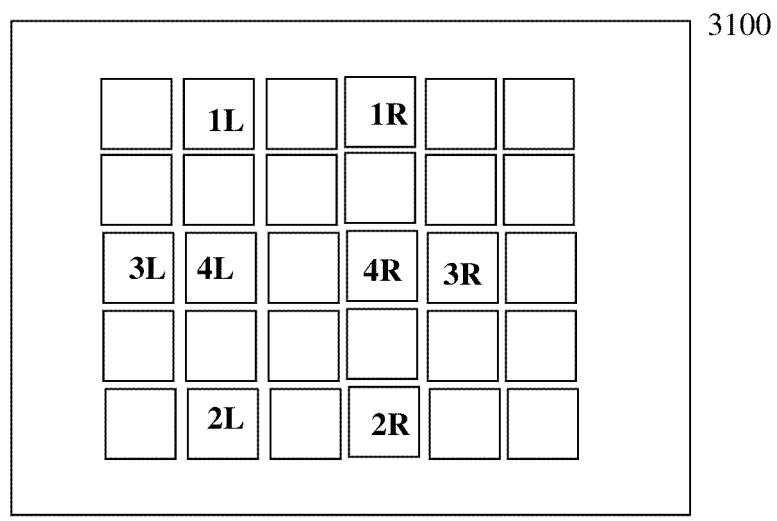

This is illustrated in FIGS. 30 and 31. For instance in FIG. 30 a touch screen 3000 is enabled to detect and follow a tactile movement on the screen. The squares imply a certain resolution of the screen. It is assumed that the touch-screen has a sufficient resolution to detect any drawn pattern at a very rapid rate. This requires that in one embodiment of the present invention the touch screen has a responsiveness of less than 10 ms; that in one embodiment of the present invention the touch screen has a responsiveness of less than 5 ms; and that in one embodiment of the present invention the touch screen has a responsiveness of not more than 1 ms. A responsiveness means that after a tactile input the touched section restores from the tactile touch and is ready to receive another signal.

For instance a computing device can be programmed to receive, and detect a circle (3001) a tap (3004 and 3005) a horizontal line (3002) and a vertical line (3003) for instance. The computing device can be trained to learn the patterns within certain scales. For instance the circle is learned with a diameter between 1 and 3 cm, while the orientation of drawing is clockwise, and the time of completion is less than 40 ms. Similar restrictions can be applied to the other patterns. Furthermore, the pattern has to be completed in a specific order (3001, 3002, 3003, 3004 and 3005) and within a certain time, or with predefined pauses. Other patterns are of course possible and may include triangles (in different orientations) rectangles, free squiggles, use of multiple fingers or touch points at the same time, etc. This allows a fairly complex pattern to be performed by a user in a very short time. Different patterns can be learned for different opening events or different locks. Once the pattern is recognized, the device will authorize and initiate the process for generating an opening code.

In one embodiment of the present invention the sensor is a touchpad and has no screen function.

In at least one aspect of the present invention the processor does not determine a relative position of the patterns on the touch screen or touch pad. In accordance with another aspect of the present invention, a processor also determines at least a relative position of the drawn tactile patterns. In accordance with one aspect of the present invention, the touch screen or touch pad does not represent a keyboard during touching.

A further aspect of the present invention is illustrated in FIG. 31. Herein a touch screen or a touch pad detects a touch of at least two different objects, which may be fingers, and which touch the pad or screen substantially at the same time. FIG. 31 illustrates a touch pattern of two fingers in a pattern (1L,1R), followed by (2L,2R), then by (3L,3R) and ended with (4L,4R). An additional requirement may be a relative position of the touches. Yet a further requirement may be a timing of touching.

Figure 32:
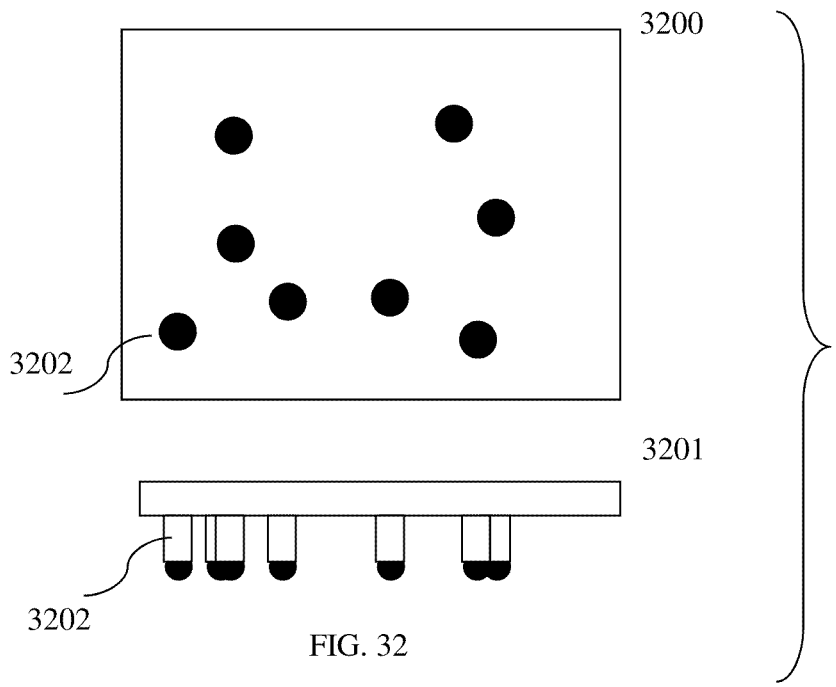
FIG. 32 illustrates a tool in accordance with an aspect of the present invention.

FIG. 32 illustrates an embodiment of the present invention wherein a touch tool is applied. The touch tool shown as 3200 from a view upon the bottom and 3201 from the side has multiple pins of which 3202 is identified that stick out and when pressed upon a touch screen or touch pad will simultaneously or substantially simultaneously activate a pattern. The pins may be provided with a spring loaded or flexible part that touches the pad. The pins can be moved around the pad, so as to create different patterns of multiple pins. The tool may have two or three pins that serve as a fixed orientation for the processor to distinguish and detect a specific pattern. Based on the sensitivity and resolution of the pad the tool can be small, for instance having a surface of about 1 cm², to about 4 cm² or to about 9 cm², or any size that will meet the requirements of the touch pad. The tool has at minimum 3 pins, preferably 7 pins, more preferably about 10 pins. Furthermore, the tool has at least 9 free positions that can hold a pin, and more preferably 16 or more positions to hold a pin. In one embodiment, one can buy a prefabricated tool with fixed positions of the pins. The computing device learns the pattern, and the tool is used to activate the device. After a certain time, one uses a new prefabricated tool with a different pattern. In one embodiment of the present invention all pins have substantially the same cross sectional shape and cross-sectional size. In a further embodiment of the present invention the cross-sectional shape of at least two pins are different, and also the cross-sectional size of at least two pins are different.

As a further aspect of the present invention a touch pad or touch screen of sufficient recovery speed and sensitivity is used to detect a drumming pattern to activate a locking/unlocking process. For instance, a user may train the processor to recognize a drum beat on the touch pad which contains a series of triplets followed by single strokes separated by pauses. One can train the processor only to accept a specific drum pattern completed within a certain time, wherein the notes are adequately and evenly spaced or wherein specific finger patterns (one, two, three or more fingers) are detected.

The requirements can be expanded to drum beats, or patterns that are virtually impossible for humans to perform with one hand. In that case a tool is provided that performs the tasks as required.

In accordance with a further aspect of the present invention the successful completion, or repetition of a given touch pattern, be it is shape, movement, order, number of fingers, timing, complexity etc. may be implemented as a game or an application on a computer or a mobile computing device. One may record a certain pattern on a pad and provide it as a challenge to other users to repeat the given patterns with the required accuracy and/or speed for instance by posting it on a social website. In accordance with a further aspect of the present invention a training program is provided that trains a human on a touch screen a beat or a touch pattern. For instance, a processor may draw on a touch screen, initially in a slow sequence, a pattern, allowing a person to track with a finger. Tempo and complexity may be increased as a user demonstrates mastering a pattern at a slow rate. Ultimately, a computer draws on a touch screen a pattern that has to be followed by a user with one or more fingers. This, in one embodiment of the present invention, can be shown on a touch screen of a computing device, and allows a user to follow the pattern shown by the computer.

In one embodiment of the present invention, the computing device with the touch screen is connected to a network. This allows at least two users connected to the network to have a contest. As a first aspect of the present invention a first user provides a pattern that is recorded by a computer and has to be repeated by a second user. The computer may indicate where and how the second user fails to follow the pattern. This allows the second user to adjust. It should be clear that one can hold a context wherein at least two users demonstrate a capability to make up and execute a (complex) pattern on a touch pad and a capability of a second user to repeat such a pattern. One may also challenge the first user to repeat the pattern that was applied as a challenge. The touching patterns from each of the users can be recorded and shown to viewers who are also connected to the network. In a further embodiment of the present invention a pattern is executed on a touch pad and may be perform with one finger, two fingers, one hand or two or more hands. In yet a further embodiment of the present invention the patterns are performed on a touch pad and shown on a separate screen.

Clearly, very complex touching patterns are possible on at least one touch pad, which may be a touch screen. The complexity of a touching pattern may be caused by its shape (lines, geometric shapes like circles, rectangles, triangles, crosses, relative angles of lines), the speed and/or relative position of touching, number of required concurrent touch points, distance between touch points, order of touch points, timing of touch points, number of different touch pads, for instance at least two at the same time and/or any combination of the above and other limitations that determine a touching complexity.

A pattern may be stored in a computer memory and replayed on a screen, showing lines, points, figures or other indications including providing a sound signal to allow a user to learn the pattern. Such a display by a computer may include displaying only part of a pattern, preferably at a lower than a final speed, allowing a user to learn the pattern. The speed and number of elements of a pattern may increase as a user continues to try to repeat the pattern as displayed by the computer. The learning may also be a competitive activity, either against another uses or against the computer, wherein the repeating of displayed patterns continues until a user makes a mistake in a repeat, either by not being timely or by touching a pad with a wrong pattern element in a series of pattern elements.

In a further embodiment of the present invention, a computer sets an accuracy for a pattern, either in time, location, order, and/or shape. For instance circle shape may be required to be between an outer circle and an inner circle as shown in FIG. 30 with boundaries 3007. A method of recognition in one embodiment of the present invention is template recognition. In such a mode a user enters a pattern several times. The processor traces an element such as loop 3001 and provides the traces with a certain margin. After this learning process, a loop drawn by a user should fall within the margins of the previously traced loops. This method of learning can be applied to any shape. In addition, some adjusting measures can be taken. For instance, a line such as 3002, may be drawn as a straight line, but has a certain angle, which is less than for instance 30 degrees.

The processor can normalize orientations of shapes to for instance a horizontal orientation, such as 3002 or a vertical orientation such as 3003 during detection. In a further embodiment of the present invention, an accurate or substantially accurate template for a pattern is provided to a processor. The processor displays the pattern and a user enters the patterns in a preferred tempo on the touch pad. Based on the input by the user, the processor determines a margin in the template that will accept the user input. In a further embodiment of the present invention, the user can widen or narrow a margin of acceptance in the processor.

In a further embodiment of the present invention, steps of the methods as provided herein are programmed and executed on a processor, which is part of a computing device.

Figure 33:
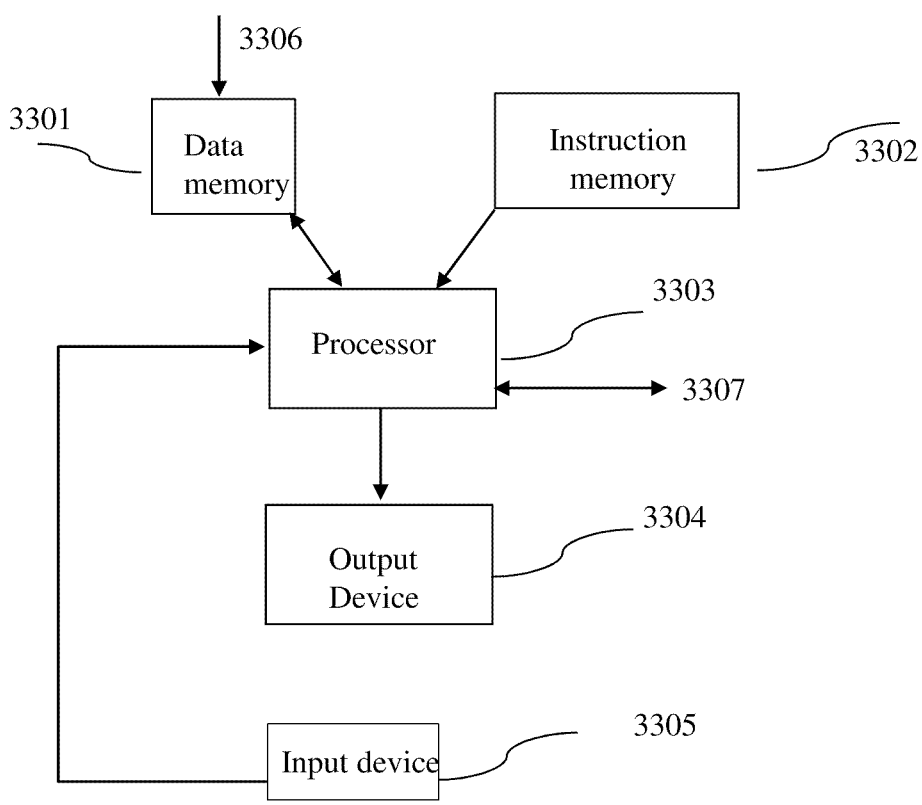
FIG. 33 illustrates a processor based system enabled to perform steps in accordance with at least one aspect of the present invention.

The methods as provided herein are in one embodiment of the present invention implemented on a system or a computer device. A system illustrated in FIG. 33 and as described herein is enabled for receiving, processing and generating data. The system is provided with data that can be stored on a memory 3301. Data may be obtained from a sensor or may be provided from a data source. Data may be provided on an input 3306. The processor is also provided or programmed with an instruction set or program executing the methods of the present invention is stored on a memory 3302 and is provided to the processor 3303, which executes the instructions of 3302 to process the data from 3301. Data, such as an image or any other signal resulting from the processor can be outputted on an output device 3304, which may be a display to display data or a loudspeaker to provide an acoustic signal. The processor also has a communication channel 3307 to receive external data from a communication device and to transmit data, for instance to an external device. The system in one embodiment of the present invention has an input device 3305, which may be a keyboard, a mouse, a touch pad or any other device that can generated data to be provided to processor 3303. The processor can be dedicated hardware. However, the processor can also be a CPU or any other computing device that can execute the instructions of 3302. Accordingly, the system as illustrated in FIG. 33 provides a system for data processing resulting from a sensor or any other data source and is enabled to execute the steps of the methods as provided herein as an aspect of the present invention.

Accordingly, this aspect is not limited to a specific unlocking or opening mechanism. The following patent applications, including the specifications, claims and drawings, are hereby incorporated by reference herein, as if they were fully set forth herein: (1) U.S. Non-Provisional patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS; (2) U.S. Non-Provisional patent application Ser. No. 10/936,181, filed Sep. 8, 2004, entitled TERNARY AND HIGHER MULTI-VALUE SCRAMBLERS/DESCRAMBLERS; (3) U.S. Non-Provisional patent application Ser. No. 10/912,954, filed Aug. 6, 2004, entitled TERNARY AND HIGHER MULTI-VALUE SCRAMBLERS/DESCRAMBLERS; (4) U.S. Non-Provisional patent application Ser. No. 11/042,645, filed Jan. 25, 2005, entitled MULTI-VALUED SCRAMBLING AND DESCRAMBLING OF DIGITAL DATA ON OPTICAL DISKS AND OTHER STORAGE MEDIA; (5) U.S. Non-Provisional patent application Ser. No. 11/000,218, filed Nov. 30, 2004, entitled SINGLE AND COMPOSITE BINARY AND MULTI-VALUED LOGIC FUNCTIONS FROM GATES AND INVERTERS; (6) U.S. Non-Provisional patent application Ser. No. 11/065,836 filed Feb. 25, 2005, entitled GENERATION AND DETECTION OF NON-BINARY DIGITAL SEQUENCES; (7) U.S. Non-Provisional patent application Ser. No. 11/139,835 filed May 27, 2005, entitled Multi-Valued Digital Information Retaining Elements and Memory Devices; (8) U.S. Non-Provisional patent application Ser. No. 12/137,945 filed on Jun. 12, 2008, entitled Methods and Systems for Processing of n-State Symbols with XOR and EQUALITY Binary Functions; (9) U.S. Non-Provisional patent application Ser. No. 11/679,316, filed on Feb. 27, 2007, entitled METHODS AND APPARATUS IN FINITE FIELD POLYNOMIAL IMPLEMENTATIONS; (10) U.S. Non-Provisional patent application Ser. No. 11/696,261, filed on Apr. 4, 2007, entitled BINARY AND N-VALUED LFSR AND LFCSR BASED SCRAMBLERS, DESCRAMBLERS, SEQUENCE GENERATORS AND DETECTORS IN GALOIS CONFIGURATION; (11) U.S. Non-Provisional patent application Ser. No. 11/964,507 filed on Dec. 26, 2007, entitled IMPLEMENTING LOGIC FUNCTIONS WITH NON-MAGNITUDE BASED PHYSICAL PHENOMENA; (12) U.S. Non-Provisional patent application Ser. No. 12/273,262, filed on Nov. 18, 2008, entitled Methods and Systems for N-state Symbol Processing with Binary Devices; (13) U.S. patent application Ser. No. 11/566,725, filed on Dec. 5, 2006, entitled ERROR CORRECTING DECODING FOR CONVOLUTIONAL AND RECURSIVE SYSTEMATIC CONVOLUTIONAL ENCODED SEQUENCES; (14) U.S. patent application Ser. No. 11/555,730 filed on Nov. 2, 2006, entitled SCRAMBLING AND SELF-SYNCHRONIZING DESCRAMBLING METHODS FOR BINARY AND NON-BINARY DIGITAL SIGNALS NOT USING LFSRs; (15) U.S. patent application Ser. No. 11/680,719 filed on Mar. 1, 2007, entitled MULTI-VALUED CHECK SYMBOL CALCULATION IN ERROR DETECTION AND CORRECTION; and (16) U.S. patent application Ser. No. 11/739,189 filed on Apr. 24, 2007, entitled ERROR CORRECTION BY SYMBOL RECONSTRUCTION IN BINARY AND MULTI-VALUED CYCLIC CODES.

While there have been shown, described and pointed out fundamental novel features of the invention as applied to preferred embodiments thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims.

The invention claimed is:

1. A method to synchronize a sequence generator determined by an n-state k-stage, shift register in a feedback configuration with n>1 and k>1, for generating at least one n-state symbol, each n-state symbol being represented by a signal, comprising:
   receiving by a processor k non-consecutive n-state symbols in a sequence of n-state symbols, wherein none of the k non-consecutive n-state symbols is consecutive in the sequence of n-state symbols;
   determining by the processor a generating state of the sequence generator for a starting moment, including the steps of executing k different n-state expressions wherein only the k non-consecutive n-state symbols as are variables; and
   generating by the sequence generator of the at least one n-state symbol at the starting moment with the n-state k-stage, shift register in the feedback configuration in the generating state, wherein the sequence generator is an autonomous sequence generator.

2. The method of claim 1, wherein n>2.

3. The method of claim 1, wherein coefficients of the k different n-state n-state expressions are stored in a memory.

4. The method of claim 1, further comprising:
   the processor receiving data determining a configuration of the n-state k-stage shift register in the feedback configuration; and
   the processor determining the k different n-state expressions from the at least k n-state symbols and the configuration of the n-state k-state shift register in the feedback configuration.

5. The method of claim 1, wherein the sequence generator generates a sequence that is a combination of at least two sequences.

6. The method of claim 1, wherein the generating state is part of a code hop.

7. The method of claim 1, wherein the processor is part of a device that activates a mechanism.

8. The method of claim 1, wherein the processor is part of a communication device.

9. An apparatus to synchronize a sequence generator determined by an n-state k-stage, shift register in a feedback configuration with n>1 and k>1, to generate at least one n-state symbol, each n-state symbol being represented by a signal, comprising:
   a processor configured to perform the steps of: receiving k non-consecutive n-state symbols in a sequence of n-state symbols; determining a generating state of the sequence generator for a starting moment, including the steps of executing k different n-state expressions, wherein only the k non-consecutive n-state symbols as are variables; and
   wherein the sequence generator generating the at least one n-state symbol at the starting moment with the n-state k-stage, shift register in the feedback configuration in the generating state, wherein the sequence generator is an autonomous sequence generator.

10. The apparatus of claim 9, wherein n>2.

11. The apparatus of claim 9, wherein coefficients of the k different n-state expressions are stored in a memory that is accessed by the processor.

12. The apparatus of claim 9, wherein the processor synchronizes a receiver with a transmitter.

13. The apparatus of claim 9, wherein the processor is part of a wireless receiver.

14. The apparatus of claim 9, wherein the sequence generator is a selected from the group that consists of a Gold sequence generator and a Kasami sequence generator.

15. The apparatus of claim 9, wherein the processor is part of a communication device.

16. The apparatus of claim 9, wherein the processor performs a code hop.

17. The apparatus of claim 9, wherein the processor is part of a data storage device.

18. The method of claim 1, wherein an initiation of determining the generating state is based on a prediction of at least one of a received n-state symbol in the sequence of n-state symbols.

19. The apparatus of claim 9, wherein an initiation of determining the generating state is based on a prediction of at least one of a received n-state symbol in the sequence of n-state symbols.

* * * * *